(12) United States Patent
Lee et al.

(10) Patent No.: US 12,279,426 B2
(45) Date of Patent: Apr. 15, 2025

(54) SEMICONDUCTOR DEVICE, INCLUDING ELEMENT ISOLATION LAYER AND NONVOLATILE MEMORY DEVICE INCLUDING THE SAME

(71) Applicant: SAMSUNG ELECTRONICS CO., LTD., Suwon-si (KR)

(72) Inventors: So Hyun Lee, Seoul (KR); Kang-Oh Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 773 days.

(21) Appl. No.: 17/468,917

(22) Filed: Sep. 8, 2021

(65) Prior Publication Data

US 2022/0208779 A1 Jun. 30, 2022

(30) Foreign Application Priority Data

Dec. 29, 2020 (KR) .................. 10-2020-0185851

(51) Int. Cl.
*H10B 41/35* (2023.01)
*G11C 5/06* (2006.01)
*H01L 29/06* (2006.01)
*H10B 41/10* (2023.01)
(Continued)

(52) U.S. Cl.
CPC ............ *H10B 41/35* (2023.02); *G11C 5/06* (2013.01); *H01L 29/0649* (2013.01);
(Continued)

(58) Field of Classification Search
CPC ........ H10B 41/35; H10B 41/10; H10B 41/27; H10B 41/40; H10B 41/50; H10B 43/27;
(Continued)

(56) References Cited

U.S. PATENT DOCUMENTS 6,514,830 B1 2/2003 Fang et al.
8,294,238 B2 10/2012 Kutsukake et al.
(Continued)

FOREIGN PATENT DOCUMENTS

| CN | 103050493 A | * | 4/2013 |
| CN | 107611168 | | 1/2018 |
| KR | 900019138 | | 12/1990 |

*Primary Examiner* — Mohammad M Hoque
(74) *Attorney, Agent, or Firm* — F. CHAU & ASSOCIATES, LLC

(57) ABSTRACT

A semiconductor device includes a first active region and a second active region arranged along a first direction in a substrate, an element isolation layer extending in a second direction in the substrate to isolate the first active region and the second active region, a first gate electrode extending in the first direction on the first active region, a second gate electrode extending in the first direction on the second active region, and an isolation impurity region containing impurities of a first conductivity type in the substrate and disposed below the element isolation layer, in which the isolation impurity region includes a first isolation region and a second isolation region spaced apart from each other in the second direction, and at least a part of the substrate interposed between the first gate electrode and the second gate electrode is interposed between the first isolation region and the second isolation region.

20 Claims, 28 Drawing Sheets

(51) Int. Cl.
*H10B 41/27* (2023.01)
*H10B 41/40* (2023.01)

(52) U.S. Cl.
CPC ............ *H10B 41/10* (2023.02); *H10B 41/27* (2023.02); *H10B 41/40* (2023.02)

(58) Field of Classification Search
CPC ........ H10B 43/50; H10B 43/40; H10B 43/35; G11C 5/06; G11C 5/063; H01L 29/0649; H01L 21/823481; H01L 21/823418; H01L 21/823462; H01L 21/823475; H01L 24/05; H01L 25/0657
USPC ....................................................... 257/314
See application file for complete search history.

(56) References Cited

U.S. PATENT DOCUMENTS

| | | | |
|---|---|---|---|
| 9,312,015 B1 | 4/2016 | Hsiung et al. | |
| 10,170,489 B2 | 1/2019 | Kutsukake et al. | |
| 10,256,340 B2 | 4/2019 | Chin et al. | |
| 2009/0039408 A1* | 2/2009 | Hatano | H10B 41/40 438/258 |
| 2012/0187504 A1* | 7/2012 | Igarashi | H01L 21/76895 257/E21.409 |
| 2015/0041890 A1* | 2/2015 | Campi, Jr. | H01L 29/0653 257/339 |
| 2016/0343440 A1* | 11/2016 | Hwang | H10B 43/35 |
| 2019/0057898 A1* | 2/2019 | Shim | H10B 43/35 |
| 2019/0214404 A1* | 7/2019 | Ahn | H01L 29/40117 |
| 2019/0378857 A1* | 12/2019 | Lee | H10B 41/30 |
| 2019/0393241 A1* | 12/2019 | Baek | H10B 43/27 |

* cited by examiner

SEMICONDUCTOR DEVICE, INCLUDING ELEMENT ISOLATION LAYER AND NONVOLATILE MEMORY DEVICE INCLUDING THE SAME

CROSS-REFERENCE TO RELATED APPLICATION

This application claims priority under 35 U.S.C. § 119 to Korean Patent Application No. 10-2020-0185851, filed on Dec. 29, 2020, in the Korean Intellectual Property Office, the contents of which are incorporated by reference herein in their entirety.

TECHNICAL FIELD

The present disclosure relates to a semiconductor device, a nonvolatile memory device including the same, an electronic system including the same, and a method for fabricating the same. More particularly, the present disclosure relates to a semiconductor device including an element isolation layer, a nonvolatile memory device including the same, an electronic system including the same, and a method for fabricating the same.

DISCUSSION OF RELATED ART

Recently, the trend toward lighter, thinner, shorter and smaller electronic products has resulted in an increasing demand for highly integrated semiconductor devices. As the semiconductor devices (e.g., transistors) are highly integrated, the sizes of components included in the semiconductor devices are reduced, which causes a problem of a leakage current. Therefore, it is necessary to control the leakage current of the semiconductor device to enhance performance and reliability of the semiconductor device.

On the other hand, there is a demand for a semiconductor device capable of storing a large amount of data in an electronic system that requires data storage. Accordingly, studies have been conducted, and a nonvolatile memory device including three-dimensionally arranged memory cells instead of two-dimensionally arranged memory cells is suggested as one of the techniques for increasing the data storage capacity of the semiconductor device.

SUMMARY

Embodiments of the present disclosure provide a semiconductor device whose performance and reliability are enhanced by reducing a body effect.

The embodiments of the present disclosure also provide a nonvolatile memory device including a semiconductor device whose performance and reliability are enhanced by reducing a body effect.

The embodiments of the present disclosure also provide an electronic system including a semiconductor device whose performance and reliability are enhanced by reducing a body effect.

The embodiments of the present disclosure also provide a method for fabricating a semiconductor device whose performance and reliability are enhanced by reducing a body effect.

According to an embodiment of the present disclosure, there is provided a semiconductor device including a first active region and a second active region arranged along a first direction in a substrate, an element isolation layer disposed in the substrate, the element isolation layer extending in a second direction crossing the first direction to isolate the first active region and the second active region, a first gate electrode extending in the first direction on the first active region, a second gate electrode extending in the first direction on the second active region, and an isolation impurity region containing impurities of a first conductivity type in the substrate and disposed below the element isolation layer, in which the isolation impurity region includes a first isolation region and a second isolation region spaced apart from each other in the second direction, and at least a part of the substrate interposed between the first gate electrode and the second gate electrode is interposed between the first isolation region and the second isolation region.

According to an embodiment of the present disclosure, there is provided a semiconductor device including a substrate containing impurities of a first conductivity type at a first doping concentration, an element isolation layer defining a first active region in the substrate, a first gate electrode extending in a first direction on the first active region, and an isolation impurity region containing impurities of the first conductivity type at a second doping concentration higher than the first doping concentration in the substrate and disposed below the element isolation layer, in which the isolation impurity region does not overlap at least a part of the first gate electrode in the first direction in a plan view.

According to an embodiment of the present disclosure, there is provided a nonvolatile memory device including a first substrate of a peripheral circuit region and a second substrate of a cell region, an element isolation layer defining a first active region in the first substrate, a first gate electrode extending in a first direction on the first active region, an isolation impurity region containing impurities of a first conductivity type in the first substrate and disposed below the element isolation layer, a plurality of word lines sequentially stacked on the second substrate, a channel structure disposed on the second substrate, the channel structure intersecting the plurality of word lines, and a bit line connected to the channel structure, in which the isolation impurity region does not overlap at least a part of the first gate electrode in the first direction in a plan view.

According to an embodiment of the present disclosure, there is provided an electronic system including a main substrate, a nonvolatile memory device including a first substrate of a peripheral circuit region and a second substrate of a cell region on the main substrate, and a controller electrically connected to the nonvolatile memory device on the main substrate, in which the nonvolatile memory device includes, an element isolation layer defining a first active region in the first substrate, a first gate electrode extending in a first direction on the first active region, an isolation impurity region containing impurities of a first conductivity type in the first substrate and disposed below the element isolation layer, a plurality of word lines sequentially stacked on the second substrate, a channel structure intersecting the plurality of word lines on the second substrate, and a bit line connected to the channel structure, in which the isolation impurity region does not overlap at least a part of the first gate electrode in the first direction in a plan view.

According to an embodiment of the present disclosure, there is provided a method for fabricating a semiconductor device including forming an element isolation trench defining a first active region in a substrate, forming an isolation impurity region containing impurities of a first conductivity type in the substrate exposed by the element isolation trench, and forming a first gate electrode extending in a first direction on the first active region, in which the isolation impurity region does not overlap at least a part of the first gate electrode in the first direction in a plan view.

However, embodiments of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the accompanying drawings, in which.

Figure 1:
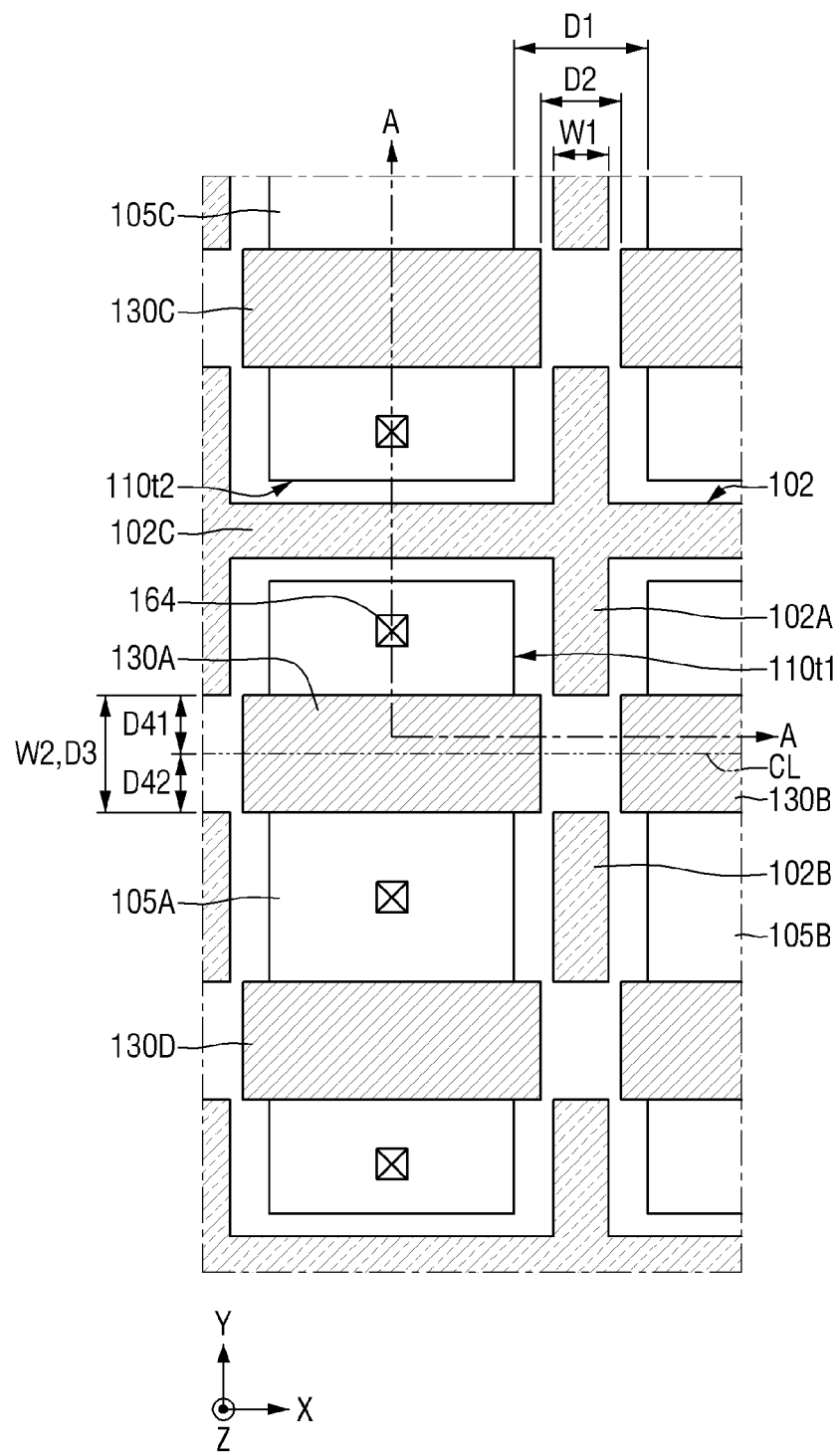
FIG. 1 is a layout diagram illustrating a semiconductor device according to an embodiment of the present disclosure.

Since the drawings in FIGS. 1-28 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a semiconductor device according to an embodiment of the present disclosure will be described with reference to FIGS. 1 to 6.

Figure 2:
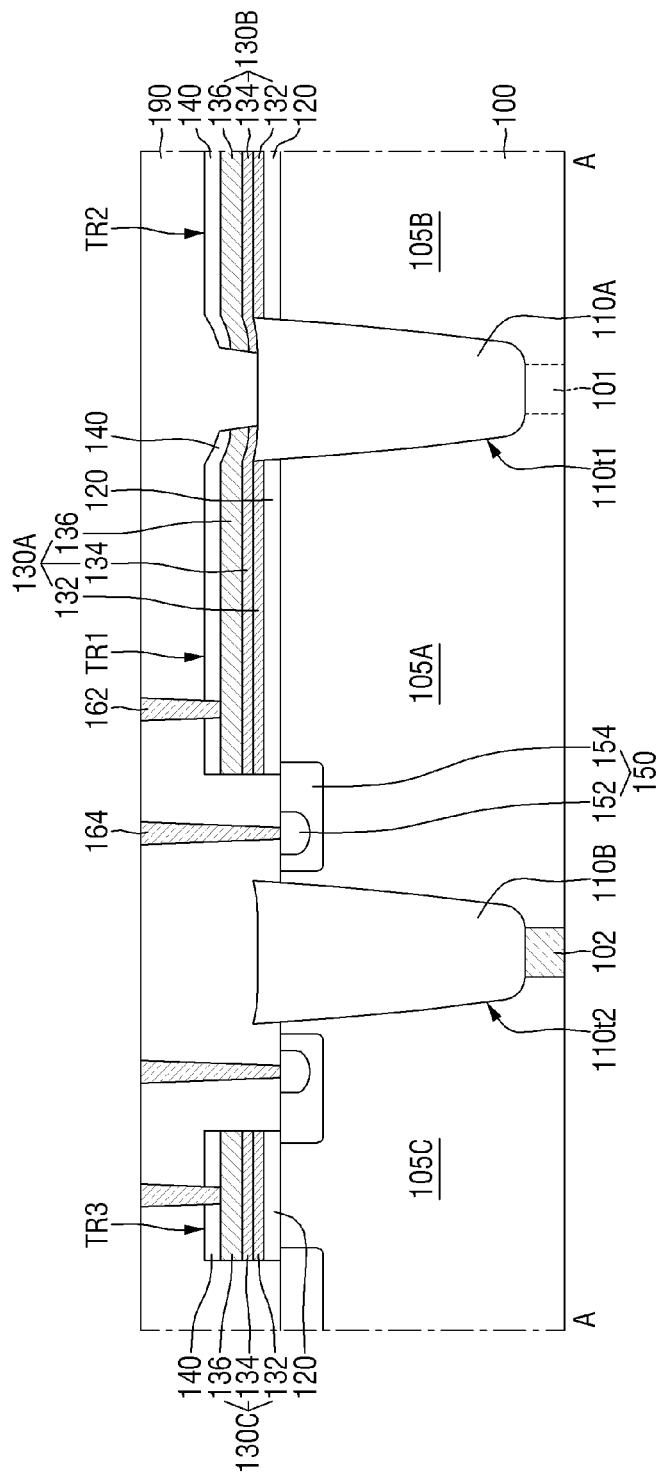
FIG. 2 is a schematic cross-sectional view taken along line A-A of FIG. 1.
Figure 3:
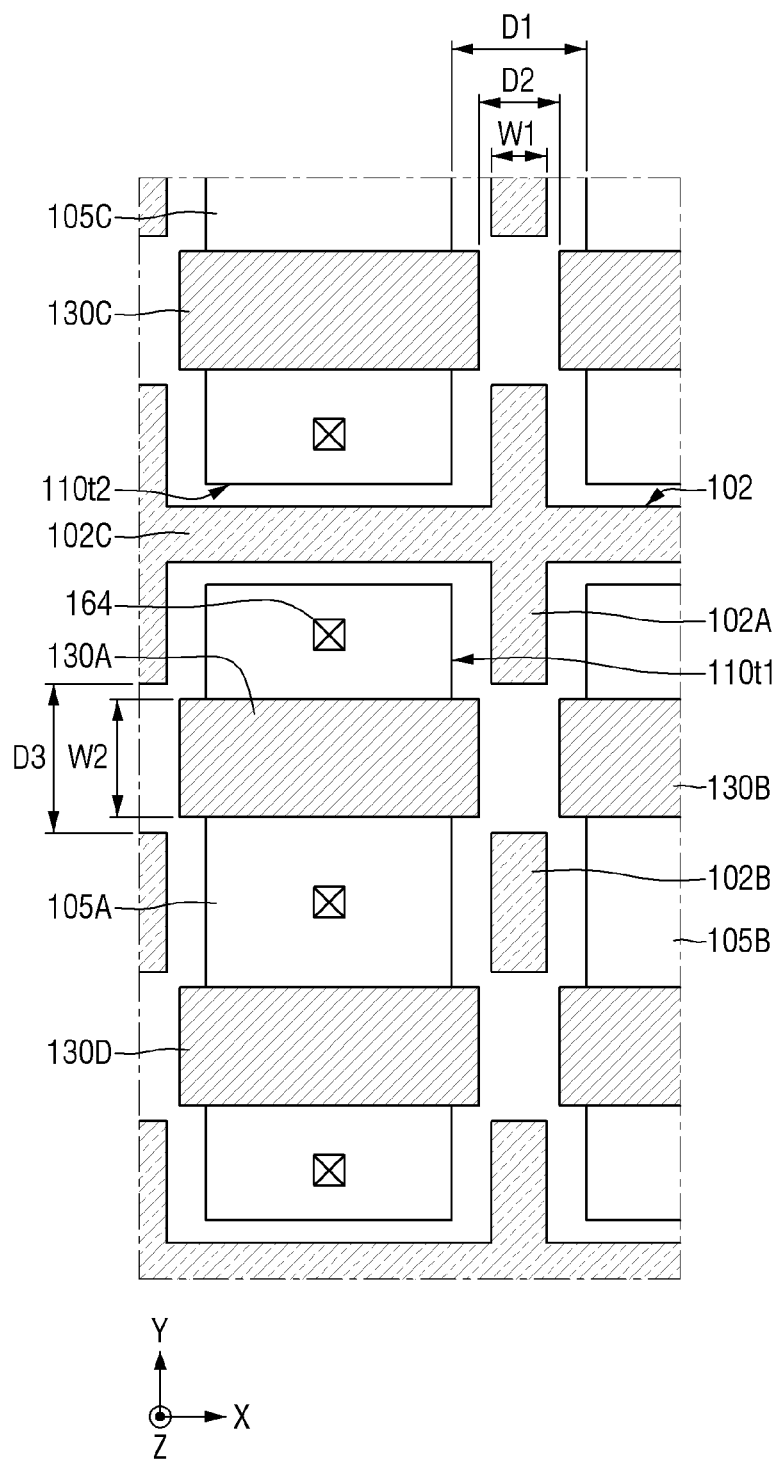
FIGS. 3 and 4 are various layout diagrams each illustrating a semiconductor device according to an embodiment of the present disclosure.
Figure 4:
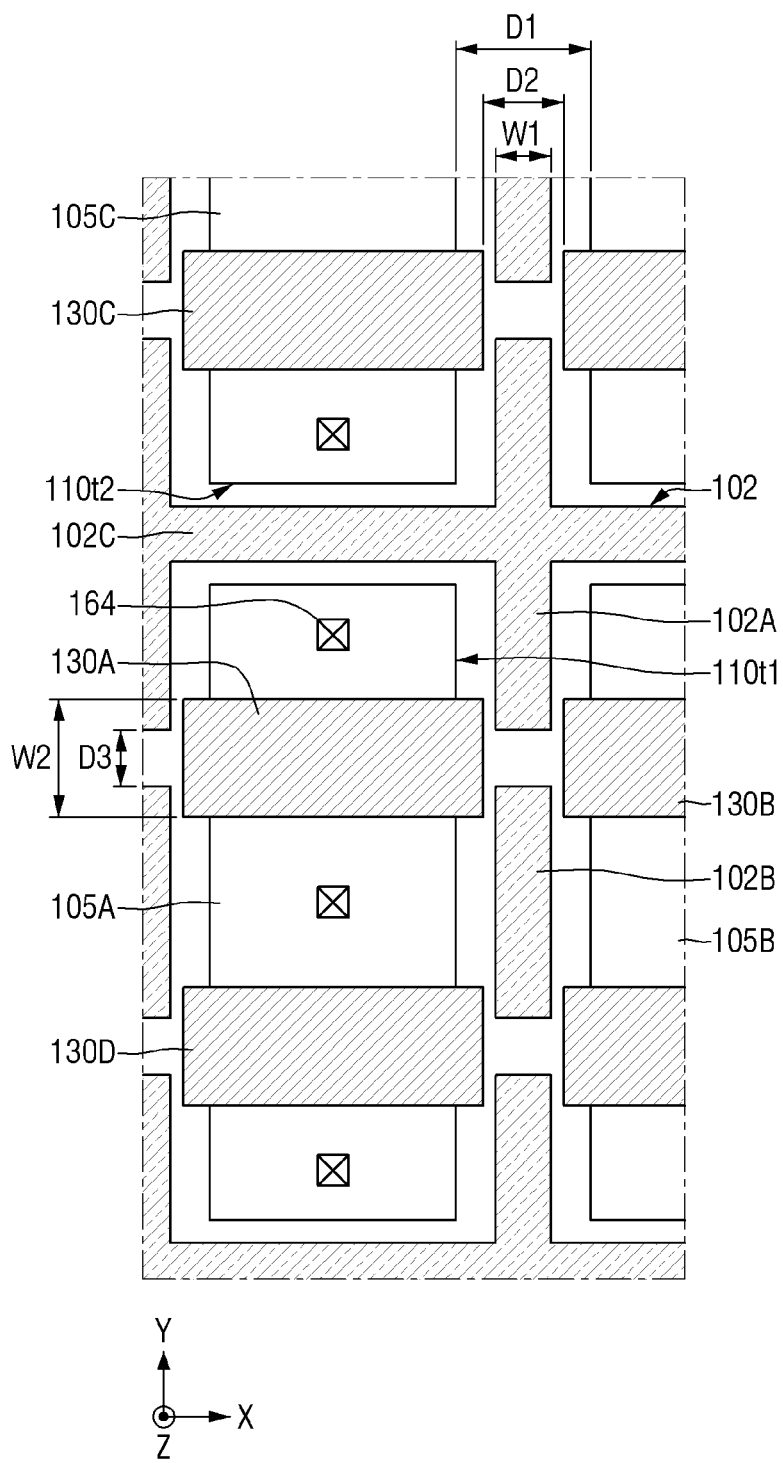

FIG. 1 is a layout diagram illustrating a semiconductor device according to an embodiment of the present disclosure. FIG. 2 is a schematic cross-sectional view taken along line A-A of FIG. 1. FIGS. 3 and 4 are various layout diagrams each illustrating a semiconductor device according to an embodiment of the present disclosure.

Referring to FIGS. 1 to 4, the semiconductor device according to an embodiment of the present disclosure may include a first substrate 100, element isolation layers 110A and 110B, first to third circuit elements TR1, TR2, and TR3, an isolation impurity region 102, an interlayer insulating layer 190, a gate contact 162 and a source/drain contact 164. For simplicity of description, the illustration of the gate contact 162 is omitted in FIG. 1.

The first substrate 100 may include a base substrate and an epitaxial layer grown on the base substrate, but the present disclosure is not limited thereto. For example, the first substrate 100 may include only the base substrate without the epitaxial layer. The first substrate 100 may be, for example, a silicon (Si) substrate, a gallium arsenide (GaAs) substrate, a silicon germanium (SiGe) substrate, a ceramic substrate, a quartz substrate, a glass substrate for a display, or a semiconductor on insulator (SOI) substrate. The substrate 100 may include a conductive area, for example, a well doped with impurities or a structure doped with impurities. In addition, the substrate 100 may include one or more semiconductor layers or structures and may include active or operable portions of semiconductor devices. In the following, a silicon (Si) substrate will be described as an example of the first substrate 100.

In an embodiment of the present disclosure, the first substrate 100 may be doped with first conductivity type impurities. For example, when the first to third circuit elements TR1, TR2, and TR3 to be described later are n-type transistors, the first substrate 100 may contain p-type impurities. The first conductivity type impurities may be p-type impurities. In an embodiment of the present disclosure, the first substrate 100 may contain a well doped with the first conductivity type impurities.

The element isolation layers 110A and 110B may define a plurality of active regions 105A, 105B, and 105C in the first substrate 100. For example, element isolation trenches 110t1 and 110t2 defining the plurality of active regions 105A, 105B, and 105C may be formed in the first substrate 100. The depth at which the element isolation trenches 110t1 and 110t2 are formed may be, e.g., about 3000 Å to about 5000 Å. The element isolation layers 110A and 110B may fill the element isolation trenches 110t1 and 110t2, respectively. For example, the element isolation layers 110A and 110B may protrude above upper surfaces of the active regions 105A, 105B, and 105C in the vertical direction (a third direction Z) while filling the element isolation trenches 110t1 and 110t2, respectively. The element isolation layers 110A and 110B may surround the active regions 105A, 105B, and 105C. The active regions 105A, 105B, and 105C may be isolated from each other by the element isolation layers 110A and 110B.

The active regions 105A, 105B, and 105C may include the first active region 105A and the second active region 105B arranged along a first direction X. The element isolation trenches 110t1 and 110t2 may include the first isolation trench 110t1 that extends in a second direction Y intersecting the first direction X to isolate the first active region 105A and the second active region 105B. The element isolation layers 110A and 110B may include the first isolation pattern 110A that fills the first isolation trench 110t1.

Further, the active regions 105A, 105B, and 105C may include the first active region 105A and the third active region 105C arranged along the second direction Y. The element isolation trenches 110t1 and 110t2 may include the second isolation trench 110t2 that extends in the first direction X to isolate the first active region 105A and the third active region 105C. The element isolation layers 110A and 110B may include the second isolation pattern 110B that fills the second isolation trench 110t2.

In an embodiment of the present disclosure, the element isolation layers 110A and 110B may protrude more upward than the top surface of the first substrate 100. For example, the uppermost portion of the element isolation layers 110A and 110B may be higher than the top surface of the first substrate 100. For example, the element isolation layers 110A and 110B may protrude from a top surface of the first active region 105A and a top surface of the second active region 105B.

Although it is illustrated that the side surfaces of the element isolation trenches 110t1 and 110t2 are inclined, this is merely the feature of the process of forming the element isolation trenches 110t1 and 110t2, and the present disclosure is not limited thereto. For example, the side surfaces of the element isolation trenches 110t1 and 110t2 may have overcut, straight vertical, or undercut profile.

Although it is illustrated that the top surfaces of the element isolation layers 110A and 110B are concave, this is merely the feature of the process of forming the element isolation layers 110A and 110B, and the present disclosure is not limited thereto. For example, the top surfaces of the element isolation layers 110A and 110B may be convex or planar.

The element isolation layers 110A and 110B may contain, but not limited to, at least one of, for example, silicon oxide ($SiO_2$), silicon oxynitride (SiON), or silicon nitride ($Si_3N_4$). The element isolation layers 110A and 110B may each include a single layer including one kind of insulating layer, a double layer including two kinds of different insulating layers, or a multilayer including a combination of at least three kinds of insulating layers.

The first to third circuit elements TR1, TR2, and TR3 may be disposed on the first to third active regions 105A, 105B, and 105C, respectively. For example, the first circuit element TR1 may be disposed on the first active region 105A, the second circuit element TR2 may be disposed on the second active region 105B, and the third element TR3 may be disposed on the third active region 105C.

The first circuit element TR1 may include a first gate electrode 130A. The first gate electrode 130A may extend in the first direction X on the first active region 105A. The second circuit element TR2 may include a second gate electrode 130B. The second gate electrode 130B may extend in the first direction X on the second active region 105B. The first gate electrode 130A and the second gate electrode 130B may be arranged along the first direction X. The third circuit element TR3 may include a third gate electrode 130C. The third gate electrode 130C may extend in the first direction X on the third active region 105C. The first gate electrode 130A and the third gate electrode 130C may be arranged along the second direction Y.

In an embodiment of the present disclosure, two or more gate electrodes may be formed on each of the first to third active regions 105A, 105B, and 105C. For example, a fourth gate electrode 130D may be further formed on the first active region 105A. The fourth gate electrode 130D may extend in the first direction X on the first active region 105A. The first gate electrode 130A and the fourth gate electrode 130D may be arranged along the second direction Y.

The first to third gate electrodes 130A, 130B, and 130C may contain, but not limited to, at least one of, for example, polycrystalline silicon (p-Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), copper (Cu), tungsten (W), palladium (Pd), silver (Ag), gold (Au), zinc (Zn), nickel (Ni), platinum (Pt), vanadium (V), or a combination thereof.

In an embodiment of the present disclosure, the first to third circuit elements TR1, TR2, and TR3 may be high-voltage transistors. For example, a high voltage of about 5 V to about 100 V may be applied to each of the first to third gate electrodes 130A, 130B, and 130C, but the present disclosure is not limited thereto.

In an embodiment of the present disclosure, each of the first to third gate electrodes 130A, 130B, and 130C may include a first conductive layer 132, a second conductive layer 134, and a third conductive layer 136 that are sequentially stacked on the first substrate 100.

The first conductive layer 132 may extend along the top surface of a gate dielectric layer 120 to be described later. In an embodiment of the present disclosure, the top surface of the first conductive layer 132 may be located at a level the same as that of the uppermost portions of the element isolation layers 110A and 110B. For example, the top surfaces of the first conductive layers 132 of the first circuit element TR1 and the second circuit element TR2 may be continuous with the top surface of the first isolation pattern 110A.

The second conductive layer 134 may extend along the top surface of the first conductive layer 132. In an embodiment of the present disclosure, the second conductive layer 134 may extend along a part of the top surfaces of the element isolation layers 110A and 110B. For example, a part of the second conductive layer 134 of the first circuit element TR1 and a part of the second conductive layer 134 of the second circuit element TR2 may overlap the first isolation pattern 110A in the third direction Z.

The third conductive layer 136 may extend along the top surface of the second conductive layer 134. In an embodiment of the present disclosure, the third conductive layer 136 may extend along a part of the top surfaces of the element isolation layers 110A and 110B. For example, the end of the third conductive layer 136 may be aligned with the end of the second conductive layer 134.

The first conductive layer 132, the second conductive layer 134, and the third conductive layer 136 may contain a conductive material. For example, the first conductive layer 132 and the second conductive layer 134 may contain polycrystalline silicon (p-Si), and the third conductive layer 136 may contain a metal (e.g., tungsten (W)). The first conductive layer 132 and the second conductive layer 134 may contain polycrystalline silicon (p-Si) doped with the first conductivity type impurities. Alternatively, the first conductive layer 132 and the second conductive layer 134 may contain polycrystalline silicon (p-Si) doped with the second conductivity type impurities.

Each of the first to third circuit elements TR1, TR2, and TR3 may include the gate dielectric layer 120. The gate dielectric layer 120 may be interposed between the first substrate 100 and each of the first to third gate electrodes 130A, 130B, and 130C. In an embodiment of the present disclosure, the end of the gate dielectric layer 120 may be aligned with the end of each of the first to third gate electrodes 130A, 130B, and 130C.

The gate dielectric layer 120 may include at least one of, for example, silicon oxide ($SiO_2$), silicon oxynitride (SiON), silicon nitride ($Si_3N_4$), or a high-k material having a dielectric constant greater than that of silicon oxide ($SiO_2$), but the present disclosure is not limited thereto. For example, the high-k material may include at least one of, for example, hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), lead zinc niobite [$Pb(Zn_{1/3}Nb_{2/3})O_3$], or a combination thereof, but the present disclosure is not limited thereto.

Each of the first to third circuit elements TR1, TR2, and TR3 may include a gate capping layer 140. The gate capping layer 140 may extend along the top surface of each of the first to third gate electrodes 130A, 130B, and 130C. In an embodiment of the present disclosure, the end of the gate capping layer 140 may be aligned with the end of each of the first to third gate electrodes 130A, 130B, and 130C. In an embodiment of the present disclosure, the gate capping layer 140 may be omitted.

The gate capping layer 140 may include at least one of, for example, silicon oxide ($SiO_2$), silicon oxynitride (SiON), silicon carbonitride (SiCN), silicon oxycarbonitride (SiOCN), or silicon nitride ($Si_3N_4$), but the present disclosure is not limited thereto. For example, the gate capping layer 140 may include silicon nitride ($Si_3N_4$).

Each of the first to third circuit elements TR1, TR2, and TR3 may include a source/drain region 150. The source/drain region 150 may be located on both sides of each of the first to third gate electrodes 130A, 130B, and 130C. Further, the source/drain region 150 may be formed in the first to third active regions 105A, 105B, and 105C.

The source/drain region 150 may be doped with second conductivity type impurities different from the first conductivity type impurities. The second conductivity type impurities may be n-type impurities. For example, when the first to third circuit elements TR1, TR2, and TR3 are n-type transistors, the source/drain region 150 may contain n-type impurities. The n-type impurities may include, but not limited to, e.g., phosphorus (P), arsenic (As), or antimony (Sb) ions.

In an embodiment of the present disclosure, the source/drain region 150 may include a low-concentration impurity region 154 and a high-concentration impurity region 152. The high-concentration impurity region 152 may be formed in the low-concentration impurity region 154. The low-concentration impurity region 154 may surround the high-concentration impurity region 152. For example, the high-concentration impurity region 152 may be formed to have a depth shallower than that of the low-concentration impurity region 154. The low-concentration impurity region 154 and the high-concentration impurity region 152 may be doped with the second conductivity type impurities. In this case, the doping concentration of the high-concentration impurity region 152 may be higher than the doping concentration of the low-concentration impurity region 154.

The isolation impurity region 102 may be formed in the first substrate 100. Further, the isolation impurity region 102 may overlap the element isolation layers 110A and 110B in the third direction Z intersecting the top surface of the first substrate 100. In other words, the isolation impurity region 102 may be formed at a portion of the first substrate 100 located below the element isolation layers 110A and 110B (i.e., located on the bottom surfaces of the element isolation layers 110A and 110B). The isolation impurity region 102 may form potential barrier to isolate the active regions 105A, 105B, and 105C, and thus to control the leakage current of the semiconductor device. Accordingly, due to the isolation by the isolation impurity region 102, the active regions 105A, 105B, and 105C adjacent to each other may have independent operation. In an embodiment of the present disclosure, the top surface of the isolation impurity region 102 may be in contact with the bottom surfaces of the element isolation layers 110A and 110B.

In an embodiment of the present disclosure, a width W1 of the isolation impurity region 102 may be smaller than a width D1 of the element isolation layers 110A and 110B. For example, the width W1 of the isolation impurity region 102 in the first direction X may be smaller than the width of the element isolation layers 110A and 110B in the first direction X (e.g., a distance D1 between the first active region 105A and the second active region 105B). Although it is illustrated that the width W1 of the isolation impurity region 102 in the first direction X is smaller than a distance D2 between the first gate electrode 130A and the second gate electrode 130B, this is merely exemplary. For example, the width W1 of the isolation impurity region 102 in the first direction X may be greater than or equal to the distance D2 between the first gate electrode 130A and the second gate electrode 130B.

The isolation impurity region 102 may be doped with the first conductivity type impurities. For example, when the first to third circuit elements TR1, TR2, and TR3 are n-type transistors, the isolation impurity region 102 may contain p-type impurities. The p-type impurities may include, but not limited to, e.g., boron (B) or aluminum (Al). In an embodiment of the present disclosure, the isolation impurity region 102 may contain boron (B). Accordingly, the isolation impurity region 102 may form a potential barrier between the first to third active regions 105A, 105B, and 105C. Thus, the isolation impurity region 102 may provide isolation between the first to third active regions 105A, 105B, and 105C.

In an embodiment of the present disclosure, the doping concentration of the isolation impurity region 102 may be higher than the doping concentration of the first substrate 100. Due to higher doping concentration of the isolation impurity region 102, a potential barrier may be formed between the first to third active regions 105A, 105B, and 105C. For example, the first substrate 100 may contain p-type impurities at a first doping concentration, and the isolation impurity region 102 may contain p-type impurities at a second doping concentration higher than the first doping concentration. In this case, the first to third circuit elements TR1, TR2, and TR3 are n-type transistors.

The isolation impurity region 102 may surround a part of each of the active regions 105A, 105B, and 105C. In other words, the isolation impurity region 102 may not completely surround the active regions 105A, 105B, and 105C. For example, the first substrate 100 may include a connection region 101 that is not separated by the isolation impurity region 102. In other words, the connection region 101 may be a region of the first substrate 100 which is located below the element isolation layers 110A and 110B and in which the isolation impurity region 102 is not formed. The connection region 101 may connect the first to third active regions 105A, 105B, and 105C. In other words, the isolation impurity region 102 forming potential barrier may not completely surround the active regions 105A, 105B, and 105C.

In an embodiment of the resent disclosure, the isolation impurity region 102 may not overlap at least a part of the first to third gate electrodes 130A, 130B, and 130C in the first direction X in a plan view. In other words, the connection region 101 may be arranged along the first direction X with each of the first to third gate electrodes 130A, 130B, and 130C. For example, the first gate electrode 130A, the connection region 101 and the second gate electrode 130B may be arranged along the first direction X.

The isolation impurity region 102 may include a first isolation region 102A and a second isolation region 102B spaced apart from each other in the second direction Y. The first isolation region 102A and the second isolation region 102B may be interposed between the first active region 105A and the second active region 105B. Further, the first isolation region 102A and the second isolation region 102B may extend in the second direction Y. In this case, at least a part of the first substrate 100 interposed between the first gate electrode 130A and the second gate electrode 130B may be disposed between the first isolation region 102A and the second isolation region 102B. In other words, the connection region 101, which is a part of the isolation impurity region 102 between the first isolation region 102A and the second isolation region 102B not formed but remained as a part of the first substrate 100, may be interposed between the first gate electrode 130A and the second gate electrode 130B.

As shown in FIG. 1, a distance D3 between the first isolation region 102A and the second isolation region 102B may be the same as a width W2 of the first gate electrode 130A. However, this is merely exemplary, and the present disclosure is not limited thereto.

In an embodiment of the present disclosure, as illustrated in FIG. 3, the distance D3 between the first isolation region 102A and the second isolation region 102B may be greater than the width W2 of the first gate electrode 130A. In an embodiment of the present disclosure, as illustrated in FIG. 4, the distance D3 between the first isolation region 102A and the second isolation region 102B may be smaller than the width W2 of the first gate electrode 130A.

In an embodiment of the present disclosure, a distance D41 between the first isolation region 102A and a centerline CL may be the same as a distance D42 between the second isolation region 102B and the centerline CL. In other words, ends of the first isolation region 102A and the second isolation region 102B facing each other are symmetric with respect to the centerline CL. The term "same" as used herein not only means being completely identical but also includes a minute difference that may occur due to a process margin and the like. The centerline CL may be an imaginary straight line extending in the first direction X while passing through the center of the first gate electrode 130A. However, the present disclosure is not limited thereto, and the distance D41 between the first isolation region 102A and the centerline CL may be different from the distance D42 between the second isolation region 102B and the centerline CL.

In an embodiment of the present disclosure, the isolation impurity region 102 may overlap the first to third gate electrodes 130A, 130B, and 130C in the second direction Y in a plan view. However, since the isolation impurity region 102 is formed at a level lower than that of the first to third gate electrodes 130A, 130B, and 130C, the isolation impurity region 102 may not overlap the first to third gate electrodes 130A, 130B, and 130C in the second direction Y in a cross-sectional view. For example, the isolation impurity region 102 may include a third isolation region 102C interposed between the first active region 105A and the third active region 105C. The third isolation region 102C may extend in the first direction X to cross between the first active region 105A and the third active region 105C. In other words, the connection region 101 may not be disposed in the third isolation region 102C.

The interlayer insulating layer 190 may be formed on the first substrate 100, and may cover the first substrate 100, the element isolation layers 110A and 110B, and the first to third circuit elements TR1, TR2, and TR3.

The interlayer insulating layer 190 may include at least one of, for example, silicon oxide ($SiO_2$), silicon nitride ($Si_3N_4$), silicon oxynitride (SiON), or a low-k material having a lower dielectric constant than silicon oxide ($SiO_2$). The low-k material may include at least one of, for example, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof, but the present disclosure is not limited thereto.

The gate contact 162 may be connected to each of the first to third gate electrodes 130A, 130B, and 130C. For example, the gate contact 162 may penetrate the interlayer insulating layer 190 and the gate capping layer 140 while extending in the third direction Z. Since the gate contact 162 is electrically connected to each of the first to third gate electrodes 130A, 130B, and 130C, it is possible to apply a voltage to each of the first to third gate electrodes 130A, 130B, and 130C.

The gate contact 162 may contain, but not limited to, a metal, e.g., aluminum (Al), copper (Cu), tungsten (W), or the like.

The source/drain contact 164 may be connected to the source/drain region 150. For example, the source/drain contact 164 may penetrate the interlayer insulating layer 190 while extending in the third direction Z. The source/drain contact 164 may be electrically connected to the source/drain region 150 to apply a voltage to the source/drain region 150. In an embodiment of the present disclosure, the source/drain contact 164 may be in contact with the high-concentration impurity region 152 of the source/drain region 150.

The source/drain contact 164 may contain, but not limited to, a metal, e.g., aluminum (Al), copper (Cu), tungsten (W), or the like.

In an embodiment of the present disclosure, at least a part of the isolation impurity region 102 and the source/drain contact 164 may be arranged along the first direction X. For example, each of the first and second isolation regions 102A and 102B and the source/drain contact 164 may be arranged along the first direction X. In an embodiment of the present disclosure, at least a part of the isolation impurity region 102 and the source/drain contact 164 may be arranged along the second direction Y. For example, the third isolation regions 102C and the source/drain contact 164 may be arranged along the second direction Y.

In an embodiment of the present disclosure, the connection region 101 may be more distant from the source/drain contact 164 than the isolation impurity region 102. In an embodiment of the present disclosure, the connection region 101 may not overlap the source/drain contact 164 in the first direction X in a plan view. Since the source/drain contact 164 may be in contact with the source/drain region 150, the connection region 101 may be more distant from the source/drain region 150 than the isolation impurity region 102. The isolation impurity region 102, for example, the first isolation region 102A and/or the second isolation 102B, may overlap the source/drain region 150 in the first direction X in a plan view. The isolation impurity region 102, for example, the third isolation region 102C, may overlap the source/drain region 150 in the second direction Y in a plan view. For example, the isolation impurity region 102 may then maintain the isolation effect between the active regions 105A, 105B, and 105C.

As the high integration of the semiconductor device is accelerated, the effect of the leakage current is increasing. For example, as the width of the element isolation layer 110A or 110B decreases, the leakage current (hereinafter, referred to as "isolation leakage current") generated along the surface of the element isolation layer 110A or 110B from the source/drain region 150 adjacent to the element isolation layer 110A or 110B may increase.

To that end, a potential barrier may be formed by forming a high-concentration impurity region on the bottom surface of the element isolation layer 110A or 110B. However, this increases a body effect. For example, a change in the transistor threshold voltage (VT) may occur due to the voltage difference between the source/drain regions 150 of the first to third circuit elements TR1, TR2, and TR3 and body (i.e., the first substrate 100). For example, the potential barrier may be formed by doping a portion of the first substrate 100 located below the element isolation layers 110A and 110B with the first conductivity type (e.g., p-type) impurities at a high concentration. However, the first conductivity type (e.g., p-type) impurities may cause a reverse bias voltage between the source regions of the first to third circuit elements TR1, TR2, and TR3 and the first substrate 100 to increase the threshold voltage (VT) of the first to third circuit elements TR1, TR2, and TR3.

In a semiconductor device according to an embodiment of the present disclosure, the isolation impurity region 102 forming the potential barrier may not completely surround the active regions 105A, 105B, and 105C. For example, as described above, the first substrate 100 may include the connection region 101 that is not isolated by the isolation impurity region 102. For example, the connection region 101 may be a region of the first substrate 100 in which the isolation impurity region 102 is not formed. Since the connection region 101 may connect the first to third active regions 105A, 105B, and 105C, the body effect may be reduced. Accordingly, it is possible to provide a semiconductor device whose performance and reliability are enhanced by reducing a body effect.

Further, in a semiconductor device according to an embodiment of the present disclosure, the isolation impurity region 102 may not overlap at least a part of the first to third gate electrodes 130A, 130B, and 130C in the first direction X in a plan view. In other words, the isolation impurity region 102 may not overlap the first to third gate electrodes 130A, 130B, and 130C at all, or may overlap only a part of the first to third gate electrodes 130A, 130B, and 130C in the first direction X in a plan view. For example, as described above, the connection region 101 may be interposed between the first gate electrode 130A and the second gate electrode 130B. Since the connection region 101 may be relatively distant from the source/drain region 150 (or the source/drain contact 164), the increase in the leakage current due to the region where the isolation impurity region 102 is not formed may be minimized. Accordingly, a semiconductor device whose performance and reliability are enhanced by preventing a leakage current and reducing a body effect may be provided.

Figure 5:
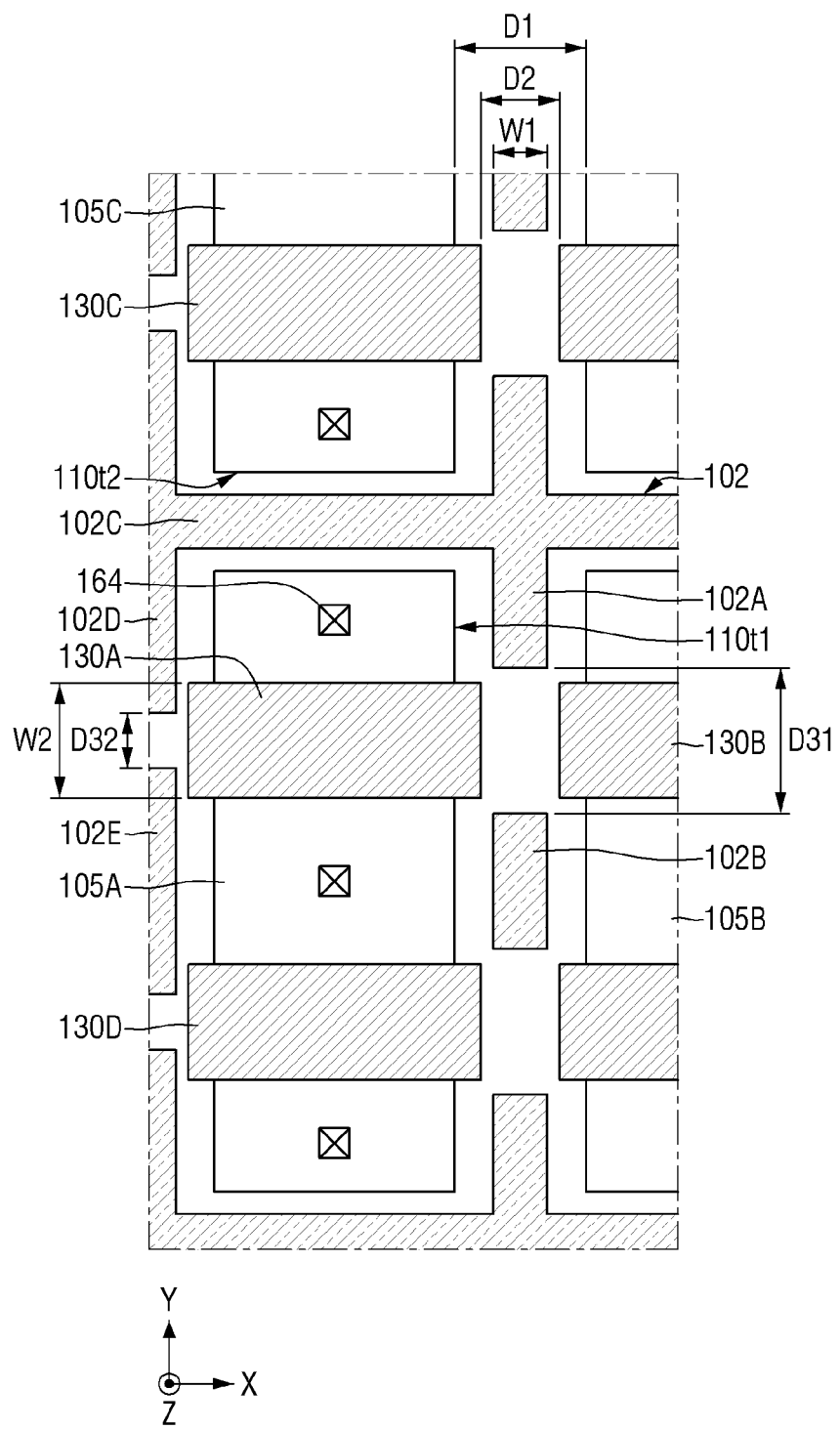
FIG. 5 is a layout diagram illustrating a semiconductor device according to an embodiment of the present disclosure.

FIG. 5 is a layout diagram illustrating a semiconductor device according to an embodiment of the present disclosure. For simplicity of description, redundant parts of the description made with reference to FIGS. 1 to 4 may be recapitulated or omitted.

Referring to FIG. 5, in a semiconductor device according to an embodiment of the present disclosure, the extension length of the connection region 101 may be different on both sides of the first to third gate electrodes 130A, 130B, and 130C.

In an embodiment of the present disclosure, the isolation impurity region 102 may further include a fourth isolation region 102D and a fifth isolation region 102E spaced apart from each other in the second direction Y. The fourth isolation region 102D and the fifth isolation region 102E may be spaced apart from the first isolation region 102A and the second isolation region 102B, respectively, in the first direction X, with the first active region 105A interposed therebetween. Further, the fourth isolation region 102D and the fifth isolation region 102E may extend in the second direction Y. In this case, a distance D32 between the fourth isolation region 102D and the fifth isolation region 102E may be different from a distance D31 between the first isolation region 102A and the second isolation region 102B. The isolation impurity region 102 including the first to fifth isolation regions 102A, 102B, 102C, 102D and 102E may be applied in the form of islands between the first to third active regions 105A, 105B, and 105C to surround the first to third active regions 105A, 105B, and 105C, and thus the isolation effect between the first to third active regions 105A, 105B, and 105C may be maintained. A region of the first substrate 100 (e.g., between the first gate electrode 130A and the second gate electrode 130B), in which the isolation impurity region 102 is not formed, may serve as a connection region 101. Since the connection region 101 may connect the first to third active regions 105A, 105B, and 105C, the body effect may be reduced.

In an embodiment of the present disclosure, the source/drain contact 164 may be closer to the fourth isolation region 102D and the fifth isolation region 102E than to the first isolation region 102A and the second isolation region 102B. In this case, the distance D32 between the fourth isolation region 102D and the fifth isolation region 102E may be smaller than the distance D31 between the first isolation region 102A and the second isolation region 102B. Since the connection region 101 interposed between the first isolation region 102A and the second isolation region 102B may be relatively distant from the source/drain region 150 (or the source/drain contact 164), the increase in the leakage current due to the region where the isolation impurity region 102 is not formed may be minimized. Accordingly, a semiconductor device whose performance and reliability are enhanced by preventing a leakage current and reducing a body effect may be provided.

Figure 6:
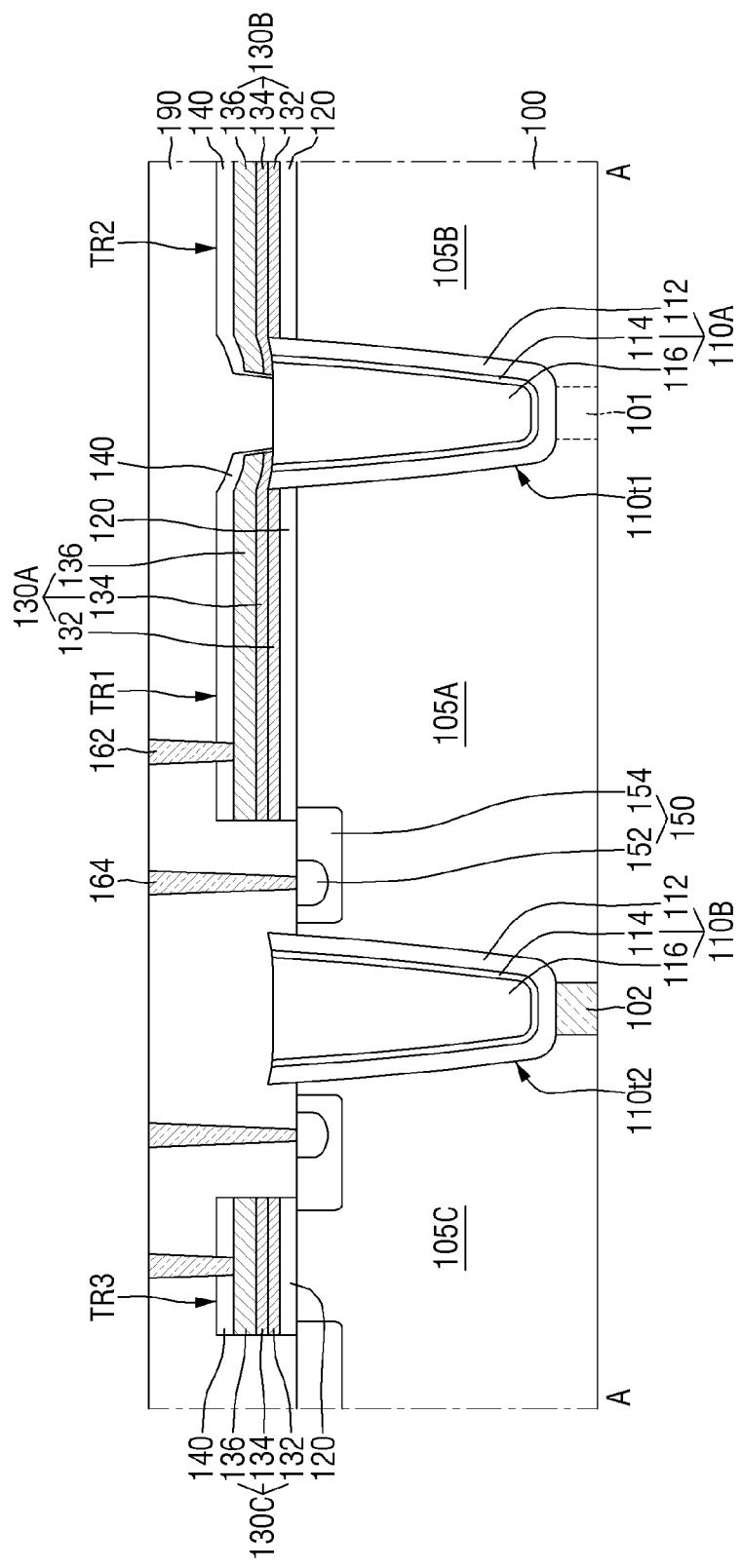
FIG. 6 is a schematic cross-sectional view illustrating a semiconductor device according to an embodiment of the present disclosure.

FIG. 6 is a schematic cross-sectional view illustrating a semiconductor device according to an embodiment of the present disclosure. For simplicity of description, redundant parts of the description made with reference to FIGS. 1 to 5 may be recapitulated or omitted.

Referring to FIG. 6, in a semiconductor device according to an embodiment of the present disclosure, each of the element isolation layers 110A and 110B may be formed of multiple layers.

In an embodiment of the present disclosure, each of the element isolation layers 110A and 110B may include an insulating liner 112, an etching stop liner 114, and a gap fill insulating layer 116 that are sequentially stacked in each of the element isolation trenches 110*t*1 and 110*t*2, respectively.

The insulating liner 112 may extend along the profile of the element isolation trenches 110*t*1 and 110*t*2. For example, the insulating liner 112 may conformally extend along the side surfaces and the bottom surfaces of the element isolation trenches 110*t*1 and 110*t*2. The etching stop liner 114 may extend along the profile of the insulating liner 112. For example, the etching stop liner 114 may conformally extend along the insulating liner 112. The gap fill insulating layer 116 may be formed on the etching stop liner 114. The gap fill insulating layer 116 may fill the areas of the element isolation trenches 110*t*1 and 110*t*2 that remain after the formation of the insulating liner 112 and the etching stop liner 114.

The insulating liner 112, the etching stop liner 114, and the gap fill insulating layer 116 may contain, but not limited to, at least one of, for example, silicon oxide ($SiO_2$), silicon nitride ($Si_3N_4$), silicon oxynitride (SiON), or a combination thereof.

In an embodiment of the present disclosure, the etching stop liner 114 may contain a material having an etching selectivity with respect to the insulating liner 112 and the gap fill insulating layer 116. For example, when the insulating liner 112 and the gap fill insulating layer 116 contain silicon oxide ($SiO_2$), the etching stop liner 114 may contain at least one of, for example, silicon nitride ($Si_3N_4$), silicon carbonitride (SiCN), silicon oxycarbonitride (SiOCN), or a combination thereof. In an embodiment of the present disclosure, the insulating liner 112 and the gap fill insulating layer 116 may contain silicon oxide ($SiO_2$), and the etching stop liner 114 may contain silicon nitride ($Si_3N_4$).

Hereinafter, a nonvolatile memory device including a semiconductor device according to an embodiment of the present disclosure will be described with reference to FIGS. 1 to 11.

Figure 7:
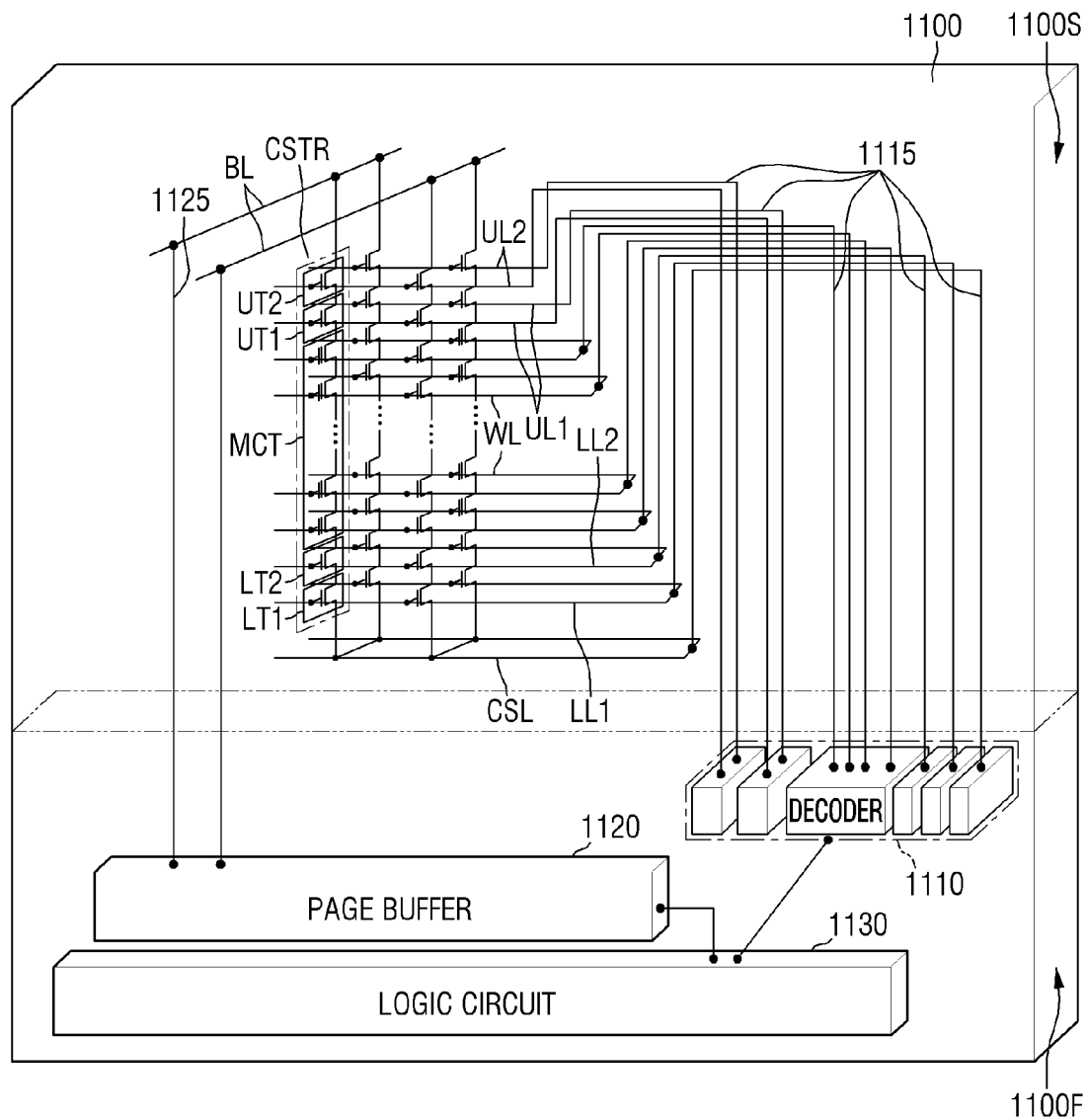
FIG. 7 is a block diagram illustrating a nonvolatile memory device including a semiconductor device according to an embodiment of the present disclosure.
Figure 8:
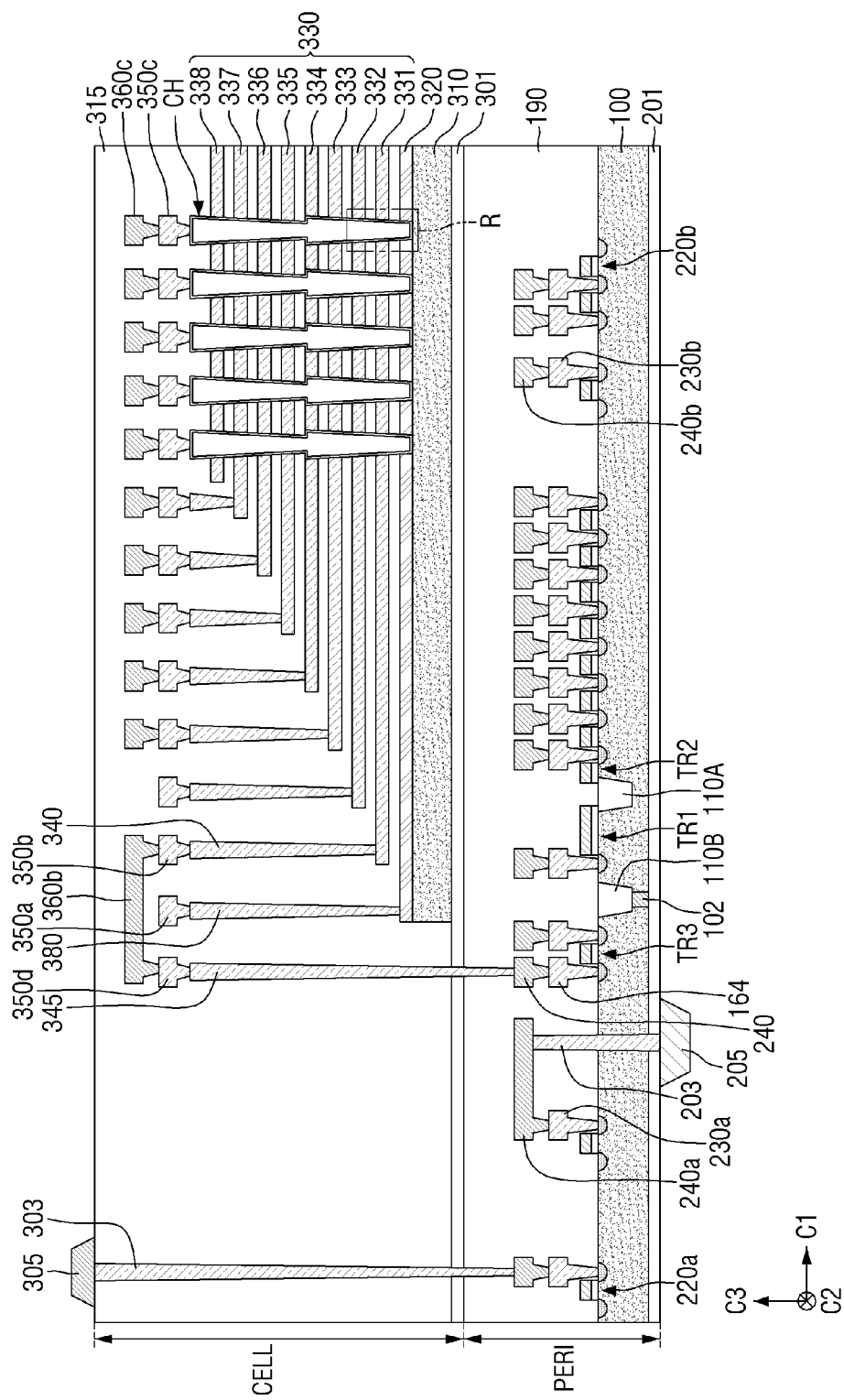
FIG. 8 is a schematic cross-sectional view illustrating a nonvolatile memory device including a semiconductor device according to an embodiment of the present disclosure.
Figure 9:
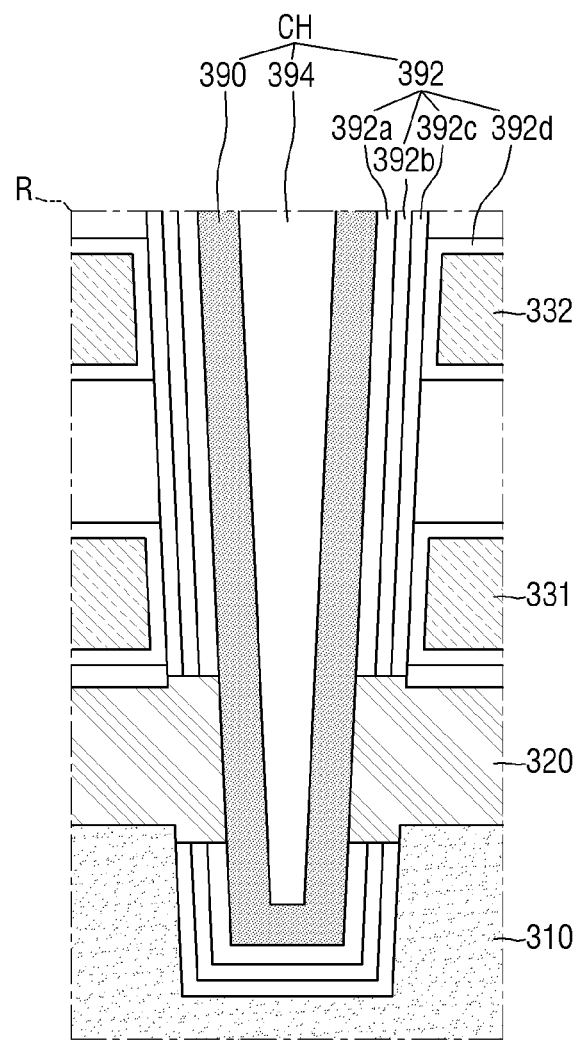
FIGS. 9 and 10 are various enlarged views of area R of FIG. 8.
Figure 10:
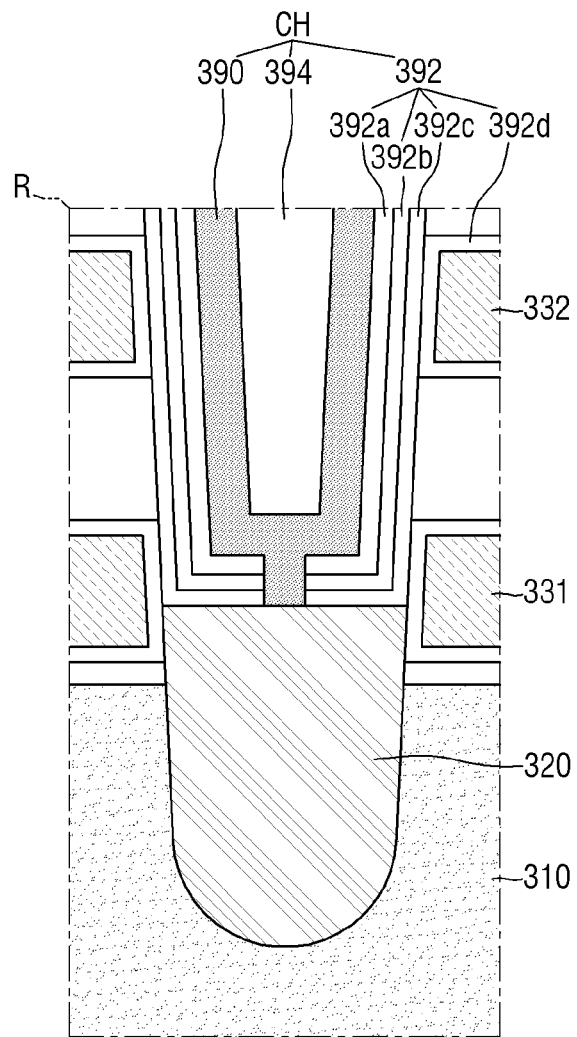

FIG. 7 is a block diagram illustrating a nonvolatile memory device including a semiconductor device according to an embodiment of the present disclosure. FIG. 8 is a schematic cross-sectional view illustrating a nonvolatile memory device including a semiconductor device according to an embodiment of the present disclosure. FIGS. 9 and 10 are various enlarged views of area R of FIG. 8. For simplicity of description, redundant parts of the description made with reference to FIGS. 1 to 6 may be recapitulated or omitted.

Referring to FIG. 7, a nonvolatile memory device including a semiconductor device according to an embodiment of the present disclosure may include a first structure 1100F and a second structure 1100S disposed on the first structure 1100F.

In an embodiment of the present disclosure, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second upper gate lines UL1 and UL2, first and second lower gate lines LL1 and LL2, and memory cell strings CSTR disposed between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may vary according to an embodiment of the present disclosure.

In an embodiment of the present disclosure, the upper transistors UT1 and UT2 may include a string select transistor, and the lower transistors LT1 and LT2 may include a ground select transistor. The first and second lower gate lines LL1 and LL2 may be gate electrodes of the lower transistors LT1 and LT2, respectively. The word lines WL may be gate electrodes of the memory cell transistors MCT, and the first and second upper gate lines UL1 and UL2 may be gate electrodes of the upper transistors UT1 and UT2, respectively.

In an embodiment of the present disclosure, the lower transistors LT1 and LT2 may include a lower erase control transistor LT1 and a ground select transistor LT2 that are connected in series. The upper transistors UT1 and UT2 may include a string select transistor UT1 and an upper erase control transistor UT2 that are connected in series. At least one of the lower erase control transistor LT1 or the upper erase control transistor UT2 may be used for an erase operation in which data stored in the memory cell transistors MCT is deleted using a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F to the second structure 1100S. The bit lines BL may be electrically connected to the page buffer 1120 through second connection wirings 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130.

Each of the decoder circuit 1110, the page buffer 1120 and the logic circuit 1130 may include a plurality of circuit devices. Each of the circuit device may include, for example, but is not limited to, a transistor. In an embodiment of the present disclosure, the decoder circuit 1110 may include the first to third circuit elements TR1, TR2, and TR3 described with reference to FIGS. 1 to 6. A nonvolatile memory device including a semiconductor device according to an embodiment of the present disclosure may perform a control operation on at least one selected memory cell transistor among a plurality of memory cell transistors MCT using the first to third circuit elements TR1, TR2, and TR3.

Further, the nonvolatile memory device including the semiconductor device according to an embodiment of the present disclosure may control the first to third circuit elements TR1, TR2, and TR3 using the logic circuit 1130. For example, the logic circuit 1130 may be connected to each of the first to third gate electrodes 130A, 130B, and 130C.

Referring to FIG. 8, a nonvolatile memory device including a semiconductor device according to an embodiment of the present disclosure may include a peripheral circuit region PERI and a cell region CELL.

The peripheral circuit region PERI may include the first substrate 100, the interlayer insulating layer 190, a plurality of circuit elements TR1, TR2, TR3, 220*a*, and 220*b* formed on the first substrate 100, first metal layers 164, 230*a*, and 230*b* connected to the circuit elements TR1, TR2, TR3, 220a, and 220b, and second metal layers 240, 240a, and 240b formed on the first metal layers 164, 230a, and 230b.

In an embodiment of the present disclosure, the first to third circuit elements TR1, TR2, and TR3 may provide the decoder circuit 1110 (see, e.g., FIG. 7) in the peripheral circuit region PERI. In an embodiment of the present disclosure, the fourth circuit element 220a may provide the logic circuit 1130 (see, e.g., FIG. 7) in the peripheral circuit region PERI. In an embodiment of the present disclosure, the fifth circuit element 220b may provide the page buffer 1120 (see, e.g., FIG. 7) in the peripheral circuit region PERI.

In this specification, only the first metal layers 164, 230a, and 230b and the second metal layers 240, 240a, and 240b are illustrated and described. However, the present disclosure is not limited thereto, and at least one metal layer may be further formed on the second metal layers 240, 240a, and 240b. At least a part of one or more metal layers formed on the second metal layers 240, 240a, and 240b may be made of aluminum (Al) or the like different from copper (Cu) that forms the second metal layers 240, 240a, and 240b.

In an embodiment of the present disclosure, the first metal layers 164, 230a, and 230b may be made of tungsten (W) having a relatively high resistance, and the second metal layers 240, 240a, and 240b may be made of copper (Cu) having a relatively low resistance.

The interlayer insulating layer 190 may be disposed on the first substrate 100 to cover the plurality of circuit elements TR1, TR2, TR3, 220a, and 220b, the first metal layers 164, 230a, and 230b, and the second metal layers 240, 240a, and 240b.

The cell region CELL may provide at least one memory block. The cell region CELL may include a second substrate 310 and a common source line 320. A plurality of word lines 330 (331 to 338) may be stacked on the second substrate 310 along a vertical direction C3 intersecting the top surface of the second substrate 310. String select lines UL1 and UL2 (see, e.g., FIG. 7) and ground select lines LL1 and LL2 (see, e.g., FIG. 7) may be disposed above and below the word lines 330, respectively, and the plurality of word lines 330 may be disposed between the string select lines and the ground select lines.

A channel structure CH may penetrate the word lines 330, the string select lines, and the ground select lines while extending in the vertical direction C3. A plurality of channel structures CH may be formed in each of the first horizontal direction (e.g., a fourth direction C1) and the second horizontal direction (e.g., a fifth direction C2) to form a channel structure array. As illustrated in FIGS. 9 and 10, the channel structure CH may include a semiconductor pattern 390 and an information storage layer 392.

The semiconductor pattern 390 may extend in the vertical direction C3. Although it is illustrated that the semiconductor pattern 390 has a cup shape, this is merely an example, and the semiconductor pattern 390 may have various shapes such as, for example, a cylindrical shape, a rectangular tubular shape, a solid pillar shape, and the like. The semiconductor pattern 390 may include, for example, a semiconductor material such as monocrystalline silicon (mono-Si), polycrystalline silicon (p-Si), organic semiconductor material, or carbon nanostructure, but the present disclosure is not limited thereto. In an embodiment of the present disclosure, the semiconductor pattern 390 may include polysilicon (p-Si) not doped with impurities.

The information storage layer 392 may be interposed between the semiconductor pattern 390 and the word lines 330. For example, the information storage layer 392 may extend along the side surface of the semiconductor pattern 390.

In an embodiment of the present disclosure, the information storage layer 392 may be formed of multiple layers. For example, the information storage layer 392 may include a tunnel insulating layer 392a, a charge storage layer 392b, and a blocking insulating layer 392c that are sequentially stacked on the semiconductor pattern 390. The tunnel insulating layer 392a may include, for example, silicon oxide ($SiO_2$) or a high-k material (e.g., aluminum oxide ($Al_2O_3$) or hafnium oxide ($HfO_2$)) having a dielectric constant higher than that of silicon oxide ($SiO_2$). The charge storage layer 392b may include, for example, silicon nitride ($Si_3N_4$). The blocking insulating layer 392c may include, for example, silicon oxide ($SiO_2$) or a high-k material having a dielectric constant higher than that of silicon oxide ($SiO_2$). In an embodiment of the present disclosure, the blocking insulating layer 392c may include a material having a dielectric constant higher than that of the tunnel insulating layer 392a. However, the present disclosure is not limited thereto. In an embodiment of the present disclosure, the information storage layer 392 may further include a gate insulating layer 392d extending along the surface of each word line 330.

In an embodiment of the present disclosure, the channel structure CH may further include a filling pattern 394. The filling pattern 394 may be formed to fill an interior of the semiconductor pattern 390 having a cup shape. Thus, the filling pattern 394 may be surrounded by the semiconductor pattern 390. The filling pattern 394 may include an insulating material, e.g., silicon oxide ($SiO_2$), but the present disclosure is not limited thereto.

The common source line 320 may be connected to the semiconductor pattern 390 of the channel structure CH.

As shown in FIG. 9, in an embodiment of the present disclosure, the channel structure CH may be buried in the second substrate 310 through the common source line 320. The common source line 320 may be connected to the side surface of the semiconductor pattern 390 while penetrating a part of the information storage layer 392.

In an embodiment of the present disclosure, as depicted in FIG. 10, at least a part of the common source line 320 may be buried in the second substrate 310. The common source line 320 may be formed from, e.g., the second substrate 310 by a selective epitaxial growth (SEG) process. The semiconductor pattern 390 may be connected to the top surface of the common source line 320 while penetrating a part of an information storage layer 392.

The channel structure CH may be electrically connected to the first metal layer 350c and the second metal layer 360c. For example, the first metal layer 350c may be a bit line contact, and the second metal layer 360c may be the bit line BL (see, e.g., FIGS. 7 and 8). In an embodiment of the present disclosure, the bit line 360c may extend along one direction (e.g., the fifth direction C2) parallel to the top surface of the second substrate 310. In an embodiment of the present disclosure, the bit line 360c may be electrically connected to the fifth circuit element 220b that provides the page buffer 1120 (see, e.g., FIG. 7) in the peripheral circuit region PERI. A plurality of bit lines BL (the second metal layers 360c) may be spaced apart from each other and extend side by side.

The word lines 330 may be connected to a plurality of cell contact plugs 340 while extending along a direction (e.g., the fourth direction C1) parallel to the top surface of the second substrate 310. The word lines 330 and the cell contact plugs 340 may be connected to each other in pads provided by at least some of the word lines 330 extending with different lengths. For example, the word lines 330 may be stacked in a stepwise form. For example, the steps included in the word lines 330 may have lengths extending in the fourth direction C1, and the lengths may gradually decrease from a lowermost one toward an uppermost one thereof. However, the present disclosure is not limited thereto. A first metal layer 350*b* and a second metal layer 360*b* may be sequentially connected to the top portions of the cell contact plugs 340 connected to the word lines 330.

In an embodiment of the present disclosure, the cell contact plugs 340 may be electrically connected to the first to third circuit elements TR1, TR2, and TR3 providing the decoder circuit 1110 (see, e.g., FIG. 7) in the peripheral circuit region PERI. For example, the first metal layer 350*b* connected to the cell contact plugs 340 may be connected to a first metal layer 350*d* by the second metal layer 360*b*. The first metal layer 350*d* may be connected to the second metal layer 240 through a connection contact plug 345. Accordingly, the first to third circuit elements TR1, TR2, and TR3 may be electrically connected to the word lines 330. For example, the first circuit element TR1 may be electrically connected to some of the word lines 330, the second circuit element TR2 may be electrically connected to some other word lines 330, and the third circuit element TR3 may be electrically connected to still some other word lines 330. In an embodiment of the present disclosure, each of the word lines 330 may be connected to the source/drain region 150. For example, each of the word lines 330 may be connected to the source/drain region 150 through the cell contact plug 340, the first metal layer 350*b*, the second metal layer 360*b*, the first metal layer 350*d*, the connection contact plug 345, the second metal layer 240, and the source/drain contact 164. The connection contact plug 345 may extend from the cell region Cell to penetrate the peripheral circuit region PERI.

In an embodiment of the present disclosure, the working voltage of the first to third circuit elements TR1, TR2, and TR3 may be different from the working voltage of the fifth circuit element 220*b* providing the page buffer 1120 (see, e.g., FIG. 7). For example, the working voltage of the fifth circuit element 220*b* may be higher than the working voltages of the first to third circuit elements TR1, TR2, and TR3.

A common source line contact plug 380 may be electrically connected to the common source line 320. The common source line contact plug 380 may be formed of a conductive material such as, for example, a metal, a metal compound, or polysilicon (p-Si), and the first metal layer 350*a* may be formed on the common source line contact plug 380.

In an embodiment of the present disclosure, below the first substrate 100, a lower insulating layer 201 may be formed to cover the bottom surface of the first substrate 100, and a first input/output pad 205 may be formed on the lower insulating layer 201. The first input/output pad 205 may be connected to at least one of the plurality of circuit elements TR1, TR2, TR3, 220*a*, and 220*b* arranged in the peripheral circuit region PERI through a first input/output contact plug 203 passing through the lower insulating layer 201 and the first substrate 100, and may be separated from the first substrate 100 by the lower insulating layer 201. In addition, a side insulating layer may be disposed between the first input/output contact plug 203 and the first substrate 100 to electrically separate the first input/output contact plug 203 from the first substrate 100.

In an embodiment of the present disclosure, an upper insulating layer 301 may be formed on the second substrate 310 to cover the bottom surface of the second substrate 310, and a second input/output pad 305 may be disposed on an interlayer insulating layer 315 of the cell region CELL. The second input/output pad 305 may be connected to at least one of the plurality of circuit elements TR1, TR2, TR3, 220*a*, and 220*b* arranged in the peripheral circuit region PERI through a second input/output contact plug 303.

In an embodiment of the present disclosure, the second substrate 310, the common source line 320, and the like may not be disposed in an area where the second input/output contact plug 303 is disposed. In addition, the second input/output pad 305 may not overlap the word lines 330 in the vertical direction C3. The second input/output contact plug 303 may be separated from the second substrate 310 in a direction (e.g., in the fourth direction C1) parallel to the top surface of the second substrate 310, and may be connected to the second input/output pad 305 while penetrating the interlayer insulating layer 315 of the cell region CELL.

In an embodiment of the present disclosure, the first input/output pad 205 and the second input/output pad 305 may be selectively formed. For example, a nonvolatile memory device including a semiconductor device according to an embodiment of the present disclosure may include only the first input/output pad 205 disposed on the first substrate 100, or may include only the second input/output pad 305 disposed on the second substrate 310. Alternatively, a nonvolatile memory device including a semiconductor device according to an embodiment of the present disclosure may include both the first input/output pad 205 and the second input/output pad 305.

Figure 11:
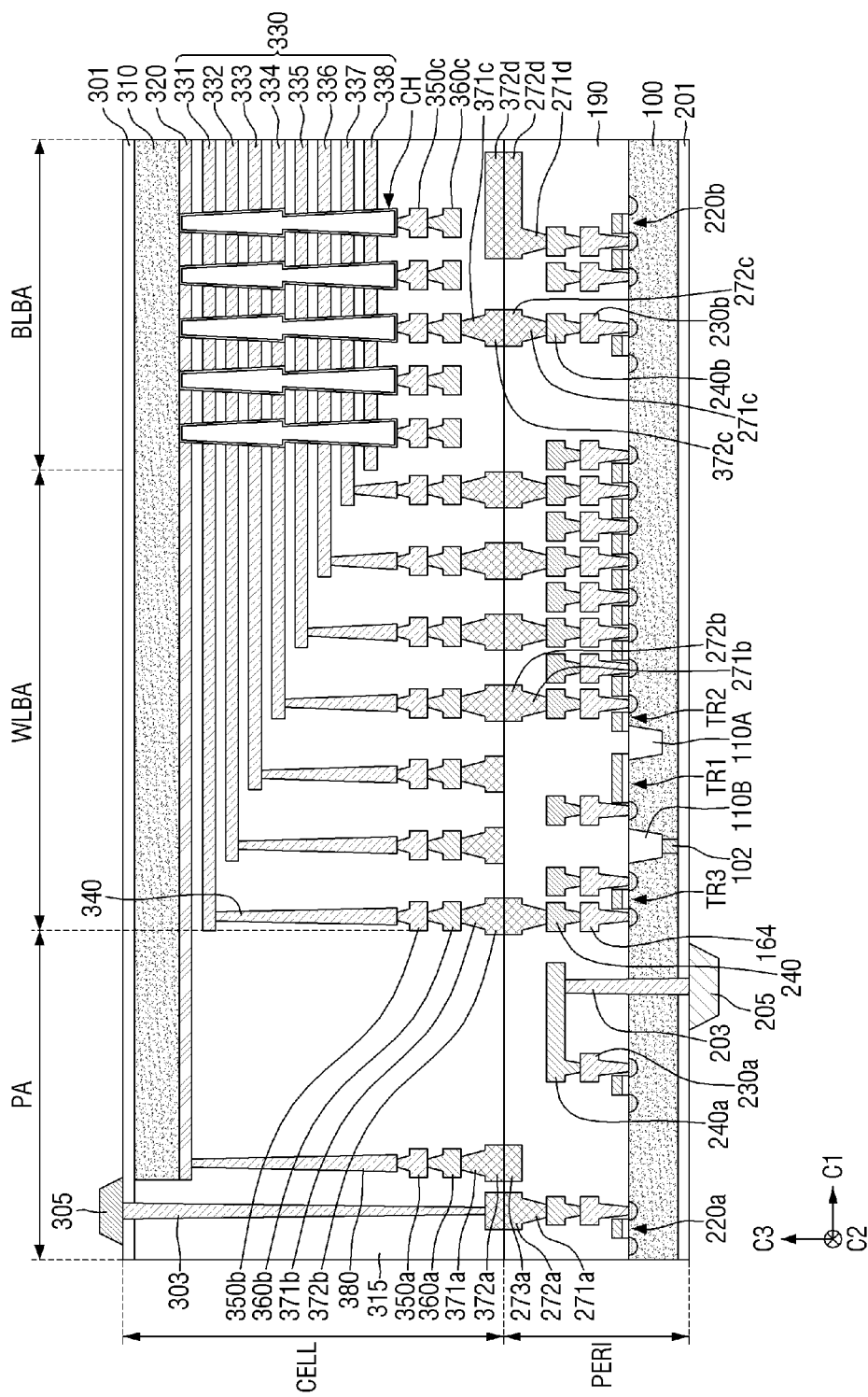
FIG. 11 is a schematic cross-sectional view illustrating a nonvolatile memory device including a semiconductor device according to an embodiment of the present disclosure.

FIG. 11 is a schematic cross-sectional view illustrating a nonvolatile memory device including a semiconductor device according to an embodiment of the present disclosure. For simplicity of description, redundant parts of the description made with reference to FIGS. 1 to 10 may be recapitulated or omitted.

Referring to FIG. 11, a nonvolatile memory device including a semiconductor device according to an embodiment of the present disclosure may be a chip to chip (C2C) structure.

The C2C structure may mean a structure obtained by manufacturing an upper chip including a cell region CELL on a first wafer, manufacturing a lower chip including a peripheral circuit region PERI on a second wafer different from the first wafer, and connecting the upper chip and the lower chip to each other by a bonding method. For example, the C2C structure may have a cell-over-peri (COP) structure. The bonding method may mean a method of electrically connecting a bonding metal formed on an uppermost metal layer of the upper chip including the cell region CELL to a bonding metal formed on an uppermost metal layer of the lower chip including the peripheral circuit region PERI. For example, when the bonding metal is formed of copper (Cu), the bonding method may be a Cu—Cu bonding method, and the bonding metal may also be formed of aluminum (Al) or tungsten (W).

In an embodiment of the present disclosure, each of the peripheral circuit region PERI and the cell region CELL may include an external pad bonding area PA, a word line bonding area WLBA, and a bit line bonding area BLBA.

The word line bonding area WLBA may be defined as an area where the plurality of cell contact plugs 340 and the like are arranged. A plurality of word lines 330 may extend to run parallel with an upper surface of the second substrate 310 and may be connected to the plurality of cell contact plugs 340. Lower bonding metals 271*b* and 272*b* may be formed on the second metal layer 240 of the word line bonding area WLBA. In the word line bonding area WLBA, the lower bonding metals 271b and 272b of the peripheral circuit region PERI may be electrically connected to upper bonding metals 371b and 372b of the cell region CELL by a bonding method. The lower bonding metals 271b and 272b and the upper bonding metals 371b and 372b may be formed of aluminum (Al), copper (Cu), or tungsten (W). The cell contact plugs 340 may be connected to the peripheral circuit region PERI through the upper bonding metals 371b and 372b of the cell region CELL and the lower bonding metals 271b and 272b of the peripheral circuit region PERI in the word line bonding area WLBA. In an embodiment of the present disclosure, each of the word lines 330 may be connected to the source/drain region 150. For example, one of the word lines 330 may be connected to the source/drain region 150 through the cell contact plug 340, the first metal layer 350b, the second metal layer 360b, the upper bonding metals 371b and 372b, the lower bonding metals 271b and 272b, the second metal layer 240, and the source/drain contact 164. For example, the lower bonding metals 271b and 272b and the upper bonding metals 371b and 372b may be bonded.

The bit line bonding area BLBA may be defined as an area where the channel structure CH, the bit line 360c, and the like are arranged. A plurality of channel structures CH may be connected to upper bonding metals 371c and 372c through the first metal layers 350c (bit line contacts) and the second metal layer 360c (bit line BL). The bit line 360c may be electrically connected to the fifth circuit element 220b in the bit line bonding area BLBA. For example, the bit line 360c may be connected to the upper bonding metals 371c and 372c in the cell region CELL, and the upper bonding metals 371c and 372c may be connected to the lower bonding metals 271c and 272c in the peripheral circuit region PERI connected to the fifth circuit element 220b.

A common source line contact plug 380 may be disposed in the external pad bonding area PA. The common source line contact plug 380 may be formed of a conductive material such as, for example, a metal, a metal compound, or polysilicon, and may be electrically connected to the common source line 320. A first metal layer 350a and a second metal layer 360a may be sequentially stacked on the common source line contact plug 380. An area in which the common source line contact plug 380, the first metal layer 350a, and the second metal layer 360a are disposed may be defined as the external pad bonding area PA. Further, input/output pads 205 and 305 may be disposed in the external pad bonding area PA. The first input/output pad 205 may be connected to at least one of the plurality of circuit elements TR1, TR2, TR3, 220a, and 220b arranged in the peripheral circuit region PERI through a first input/output contact plug 203 passing through the lower insulating layer 201 and the first substrate 100. The second input/output pad 305 may be connected to at least one of the plurality of circuit elements TR1, TR2, TR3, 220a, and 220b arranged in the peripheral circuit region PERI through a second input/output contact plug 303.

In each of the external pad bonding area PA and the bit line bonding area BLBA included in each of the cell region CELL and the peripheral circuit region PERI, an uppermost metal layer may have a metal pattern existing as a dummy pattern, or may be empty.

In a nonvolatile memory device including a semiconductor device according to an embodiment of the present disclosure, in the external pad bonding area PA, the lower metal patterns 271a, 272a, and 273a whose shapes are similar to those of the upper metal patterns 371a and 372a of the cell region CELL may be formed in the uppermost metal layer of the peripheral circuit region PERI to correspond to the upper metal patterns 371a and 372a formed in the uppermost metal layer of the cell region CELL. The upper metal patterns 371a and 372a may be the lowermost metal layer of the cell region CELL after the boding method. The lower metal patterns 271a, 272a, and 273a and the upper metal patterns 371a and 372a may be formed of, for example, aluminum (Al), copper (Cu), or tungsten (W). The lower metal patterns 271a, 272a, and 273a formed in the uppermost metal layer of the peripheral circuit region PERI may not be connected to another contact in the peripheral circuit region PERI. Similarly, in the external pad bonding area PA, corresponding to the lower metal pattern formed in the uppermost metal layer of the peripheral circuit region PERI, the upper metal pattern having the same shape as the lower metal pattern of the peripheral circuit region PERI may be formed in the upper metal layer of the cell region CELL.

Further, in the bit line bonding area BLBA, the upper metal pattern 372d whose shape is similar to those of the lower metal patterns 271d and 272d of the peripheral circuit region PERI may be formed in the uppermost metal layer of the cell region CELL to correspond to the lower metal patterns 271d and 272d formed in the uppermost metal layer of the peripheral circuit region PERI. The upper metal pattern 372d may be the lowermost metal layer of the cell region CELL after the boding method. A contact may not be formed on the upper metal pattern 372d formed in the uppermost metal layer of the cell region CELL.

Hereinafter, a method for fabricating a semiconductor device according to an embodiment of the present disclosure will be described with reference to FIGS. 1, 2 and 12 to 24.

FIGS. 12 to 24 are views illustrating the intermediate steps of a method for fabricating a semiconductor device according to an embodiment of the present disclosure. For simplicity of description, redundant parts of the description made with reference to FIGS. 1 to 11 may be recapitulated or omitted hereinbelow.

Figure 12:
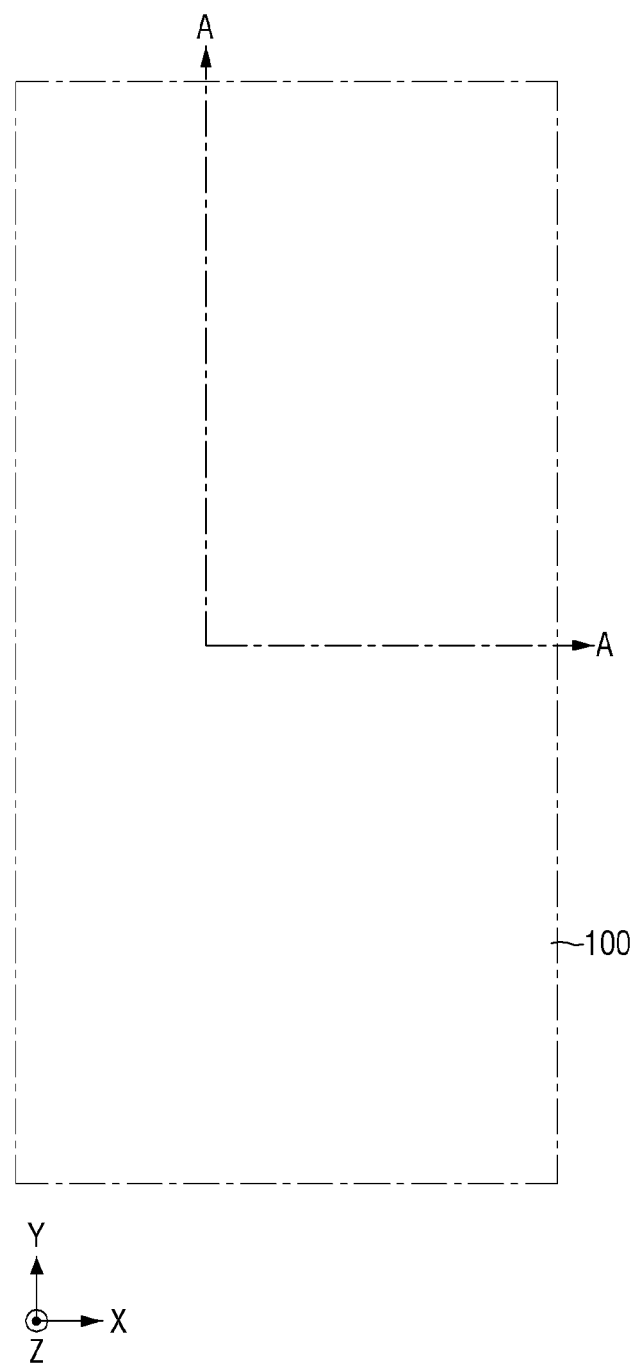
FIGS. 12 to 24 are views illustrating intermediate steps of a method for fabricating a semiconductor device according to an embodiment of the present disclosure.
Figure 13:
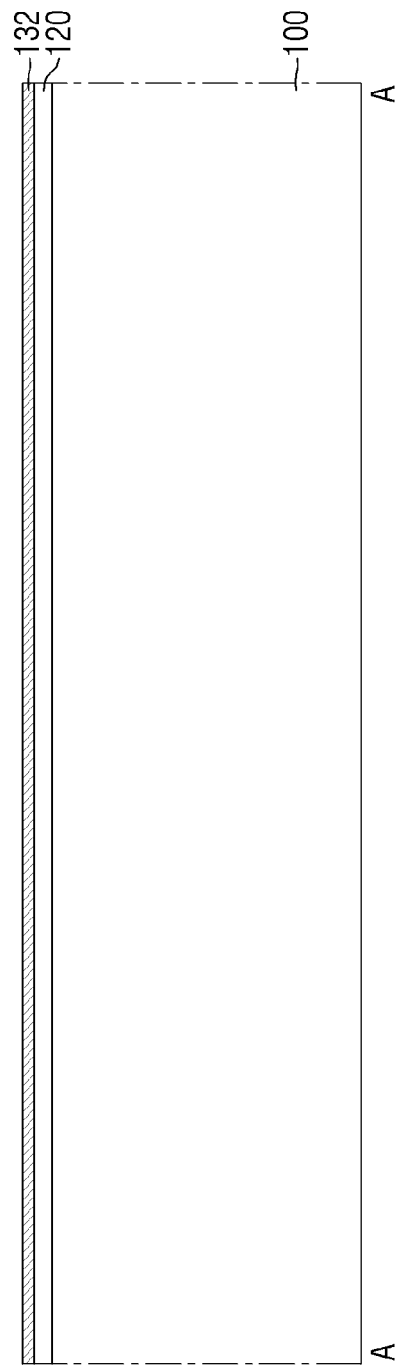

Referring to FIGS. 12 and 13, the gate dielectric layer 120 and the first conductive layer 132 are formed on the first substrate 100.

The gate dielectric layer 120 and the first conductive layer 132 may be sequentially stacked on the first substrate 100.

The gate dielectric layer 120 may include at least one of, for example, silicon oxide ($SiO_2$), silicon oxynitride (SiON), silicon nitride ($Si_3N_4$), or a high-k material having a dielectric constant greater than that of silicon oxide ($SiO_2$), but the present disclosure is not limited thereto.

The first conductive layer 132 may contain a conductive material. For example, the first conductive layer 132 may contain polycrystalline silicon (p-Si).

Figure 14:
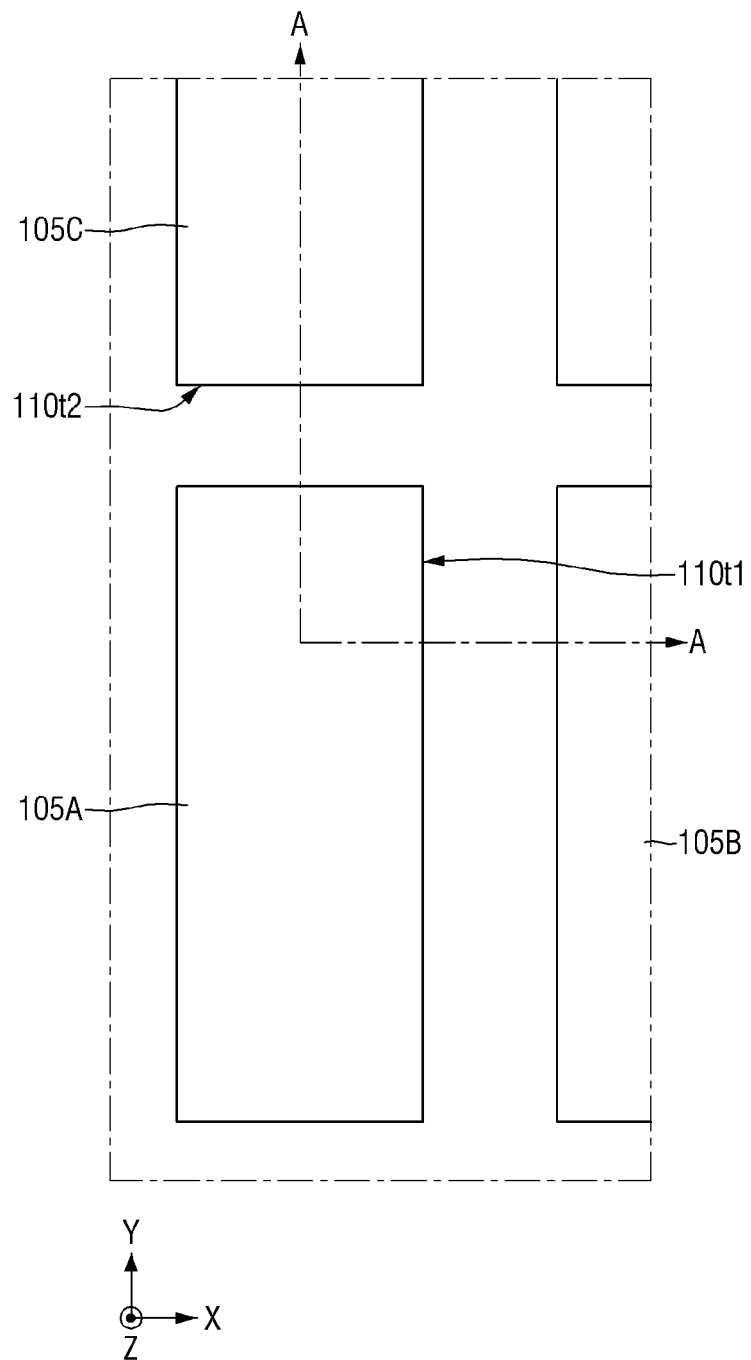
Figure 15:
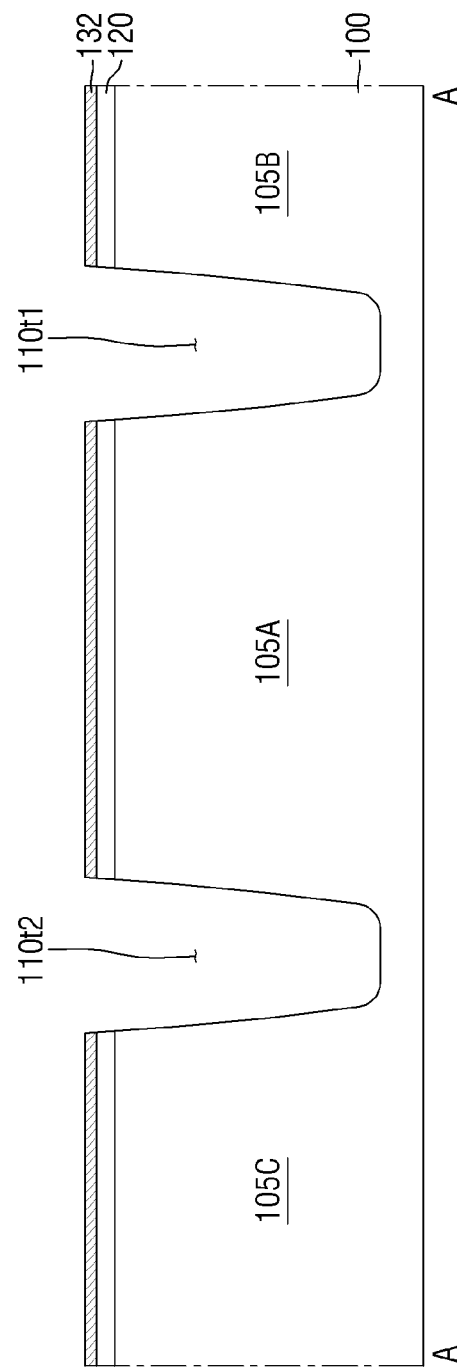

Referring to FIGS. 14 and 15, the element isolation trenches 110t1 and 110t2 are formed in the first substrate 100, the gate dielectric layer 120, and the first conductive layer 132.

The element isolation trenches 110t1 and 110t2 may define the plurality of active regions 105A, 105B, and 105C in the first substrate 100. For example, the element isolation trenches 110t1 and 110t2 may include the first isolation trench 110t1 that isolates the first active region 105A and the second active region 105B while extending in the second direction Y. Further, for example, the element isolation trenches 110t1 and 110t2 may include the second isolation trench 110*t*2 that isolates the first active region 105A and the third active region 105C while extending in the first direction X.

Figure 16:
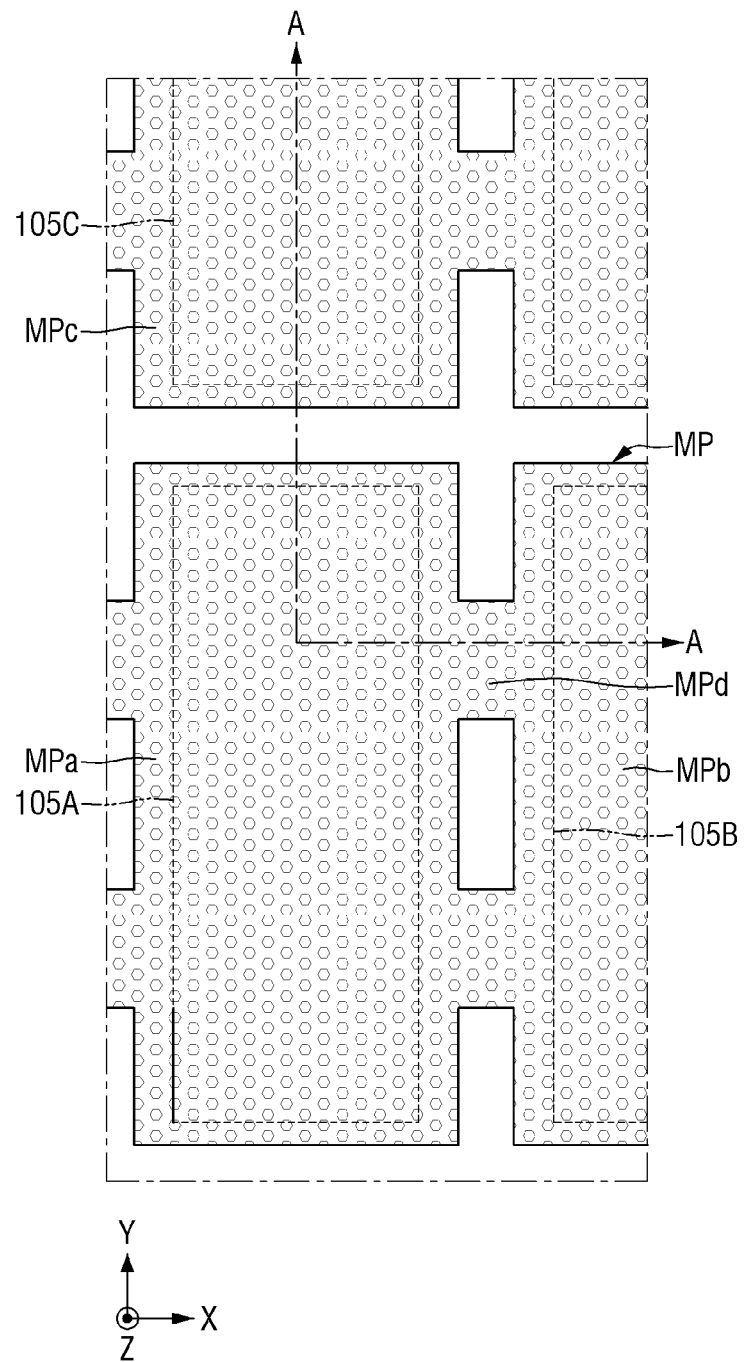
Figure 17:
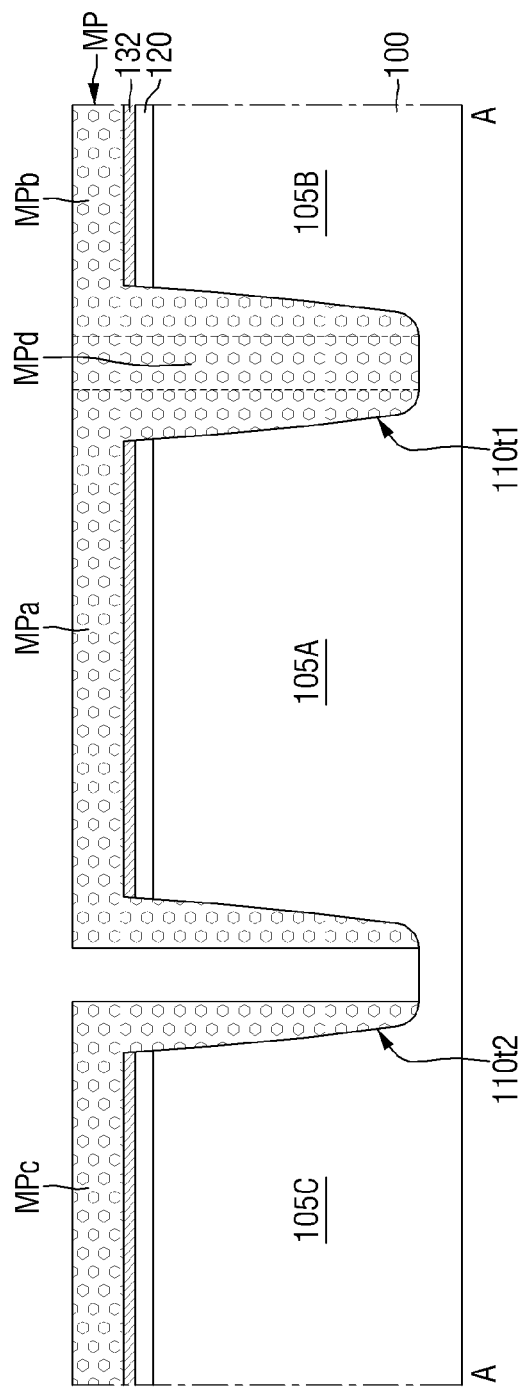

Referring to FIGS. 16 and 17, a mask pattern MP is formed on the first substrate 100.

The mask pattern MP may be formed on the first conductive layer 132, and may include, but not limited to, e.g., a photoresist.

The mask pattern MP may expose at least a part of the element isolation trenches 110*t*1 and 110*t*2. For example, the mask pattern MP may include a first mask region MPa covering the first active region 105A, a second mask region MPb covering the second active region 105B, and a third mask region MPc covering the third active region 105C. The mask pattern MP may expose the region between the first mask region MPa and the second mask region MPb. Further, the mask pattern MP may expose the region between the first mask region MPa and the third mask region MPc. The region exposed between the first mask region MPa and the second mask region MPb may be within the region occupied by the first isolation trench 110*t*1, and the region exposed between the first mask region MPa and the third mask region MPc may be within the region occupied by the second isolation trench 110*t*2. For example, a width of the region exposed between the first mask region MPa and the second mask region MPb may be smaller than a width of the first isolation trench 110*t*1 in the first direction X, and a width of the region exposed between the first mask region MPa and the third mask region MPc may be smaller than a width of the second isolation trench 110*t*2 in the second direction Y. However, the present disclosure is not limited thereto.

In an embodiment of the present disclosure, the mask pattern MP may further include a connection mask region MPd that connects the first mask region MPa to the second mask region MPb. Due to the connection mask region MPd, a part of the region between the first mask region MPa and the second mask region MPb may not be exposed. The connection mask region MPd and the first to third gate electrodes 130A, 130B, and 130C to be described later may be arranged along the first direction X.

In an embodiment of the present disclosure, the mask pattern MP may completely expose the region between the first mask region MPa and the third mask region MPc. For example, the connection mask region MPd may not connect the first mask region MPa to the third mask region MPc.

Figure 18:
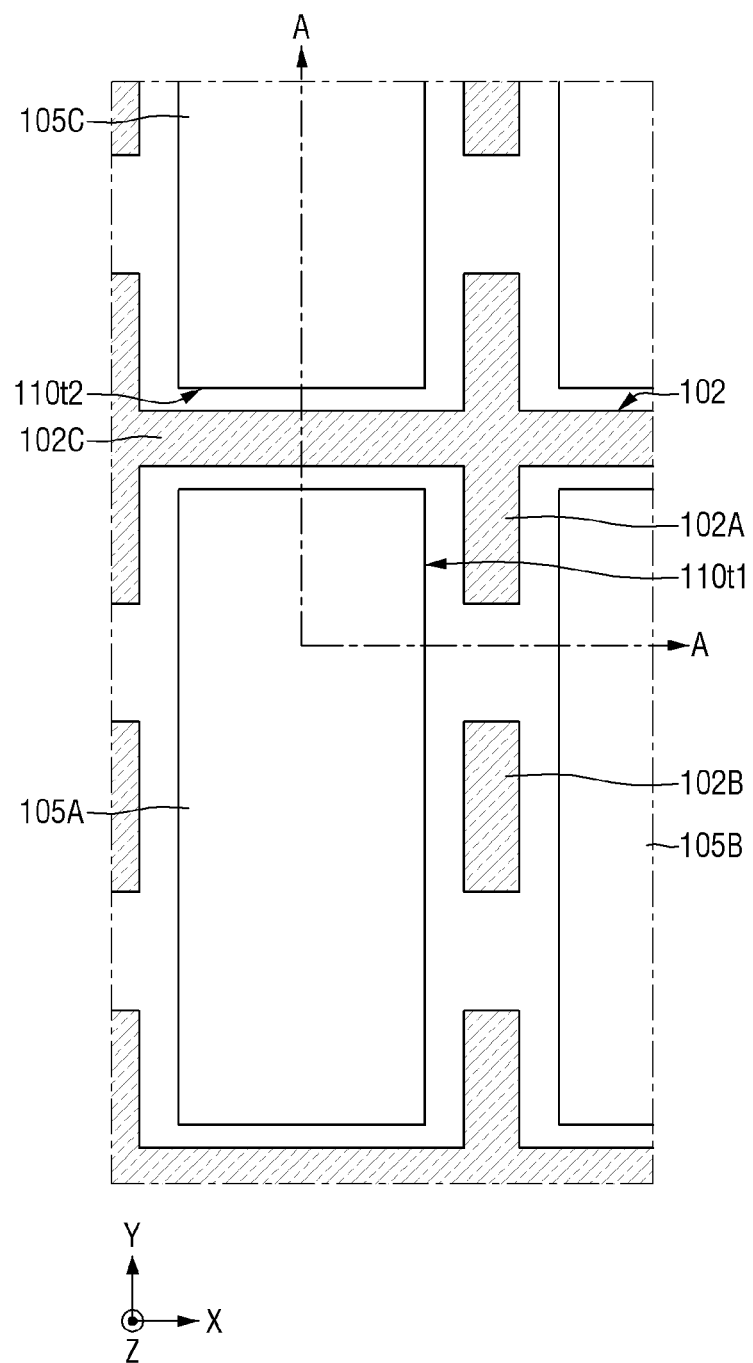
Figure 19:
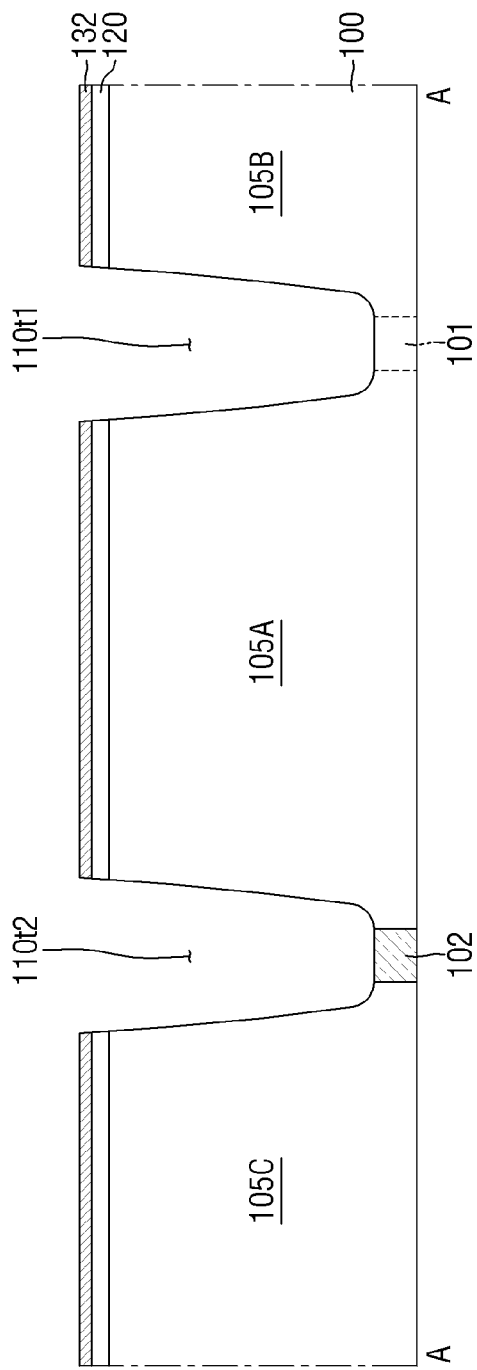

Referring to FIGS. 18 and 19, the isolation impurity region 102 is formed in the first substrate 100.

Impurities may be injected into the first substrate 100 using the mask pattern MP described with reference to FIGS. 16 and 17. Accordingly, the isolation impurity region 102 may be formed in the region of the first substrate 100 that is exposed by the mask pattern MP. The process of injecting impurities into the first substrate 100 may include, but not limited to, e.g., an ion implant process. The isolation impurity region 102 may be doped with the first conductivity type (e.g., p-type) impurities. For example, the first substrate 100 may contain p-type impurities at a first doping concentration, and the isolation impurity region 102 may contain p-type impurities at a second doping concentration higher than the first doping concentration. The isolation impurity region 102 may form a potential barrier between the first to third active regions 105A, 105B, and 105C.

In an embodiment of the present disclosure, the isolation impurity region 102 may not completely surround the active regions 105A, 105B, and 105C. For example, the connection region 101 may be formed in the region of the first substrate 100 that overlaps the connection mask region MPd described with reference to FIGS. 16 and 17.

Figure 20:
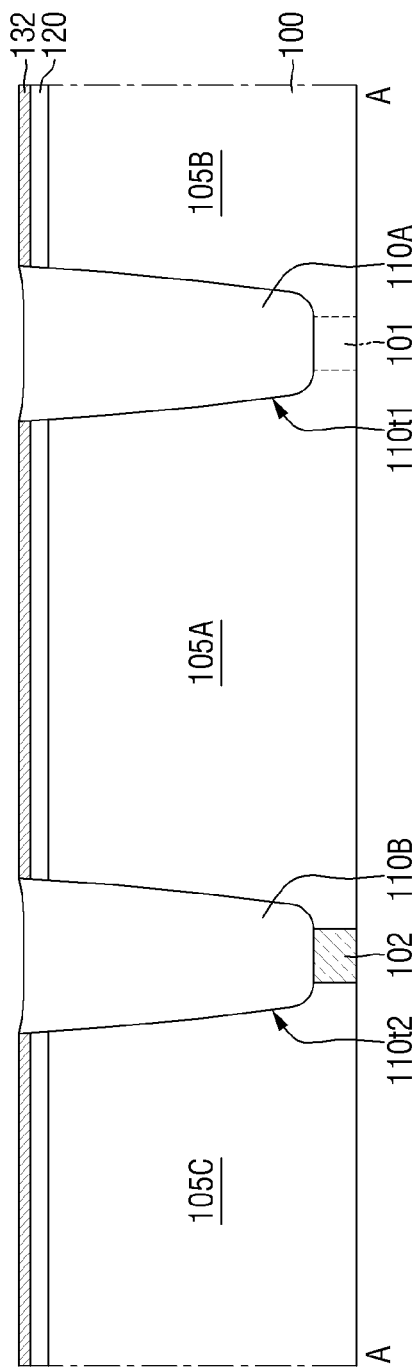

Then, referring to FIG. 20, the element isolation layers 110A and 110B are formed in the element isolation trenches 110*t*1 and 110*t*2, respectively.

The element isolation layers 110A and 110B may fill the element isolation trenches 110*t*1 and 110*t*2, respectively. Accordingly, the element isolation layers 110A and 110B defining the plurality of active regions 105A, 105B, and 105C may be formed in the first substrate 100.

The element isolation layers 110A and 110B may contain, but not limited to, at least one of, for example, silicon oxide ($SiO_2$), silicon oxynitride (SiON), or silicon nitride ($Si_3N_4$).

Figure 21:
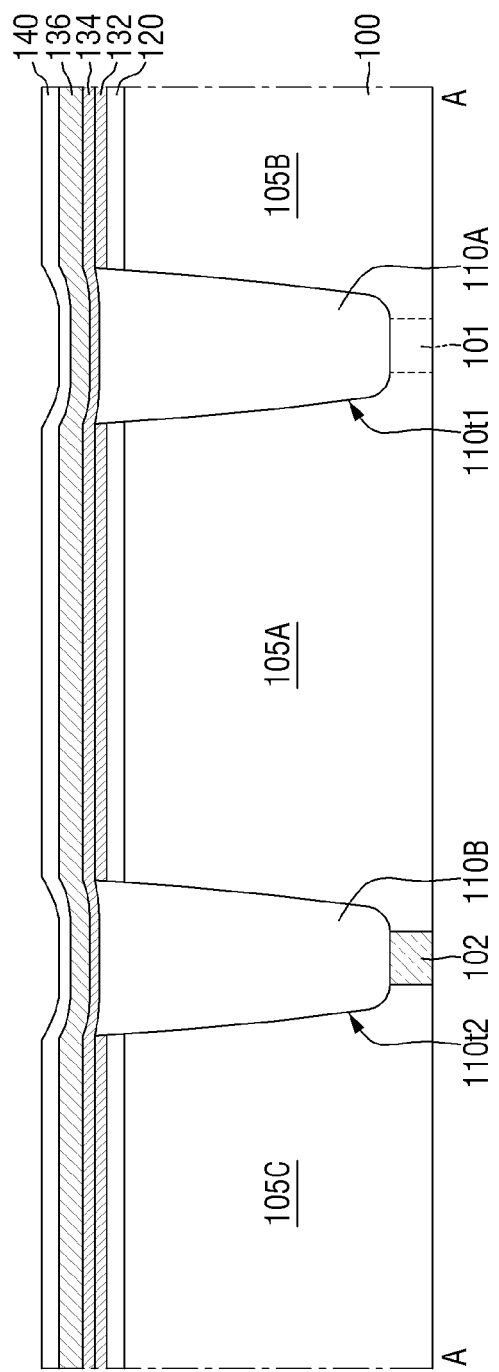

Referring to FIG. 21, the second conductive layer 134, the third conductive layer 136, and the gate capping layer 140 are formed on the first substrate 100 and the element isolation layers 110A and 110B.

The second conductive layer 134, the third conductive layer 136, and the gate capping layer 140 may be sequentially stacked on the first substrate 100 and the element isolation layers 110A and 110B.

Each of the second conductive layer 134 and the third conductive layer 136 may contain a conductive material. In an embodiment of the present disclosure, the second conductive layer 134 may contain polycrystalline silicon (p-Si), and the third conductive layer 136 may contain a metal (e.g., tungsten (W)).

The gate capping layer 140 may include at least one of, for example, silicon oxide ($SiO_2$), silicon oxynitride (SiON), or silicon nitride ($Si_3N_4$), but the present disclosure is not limited thereto. For example, the gate capping layer 140 may include silicon nitride ($Si_3N_4$).

Figure 22:
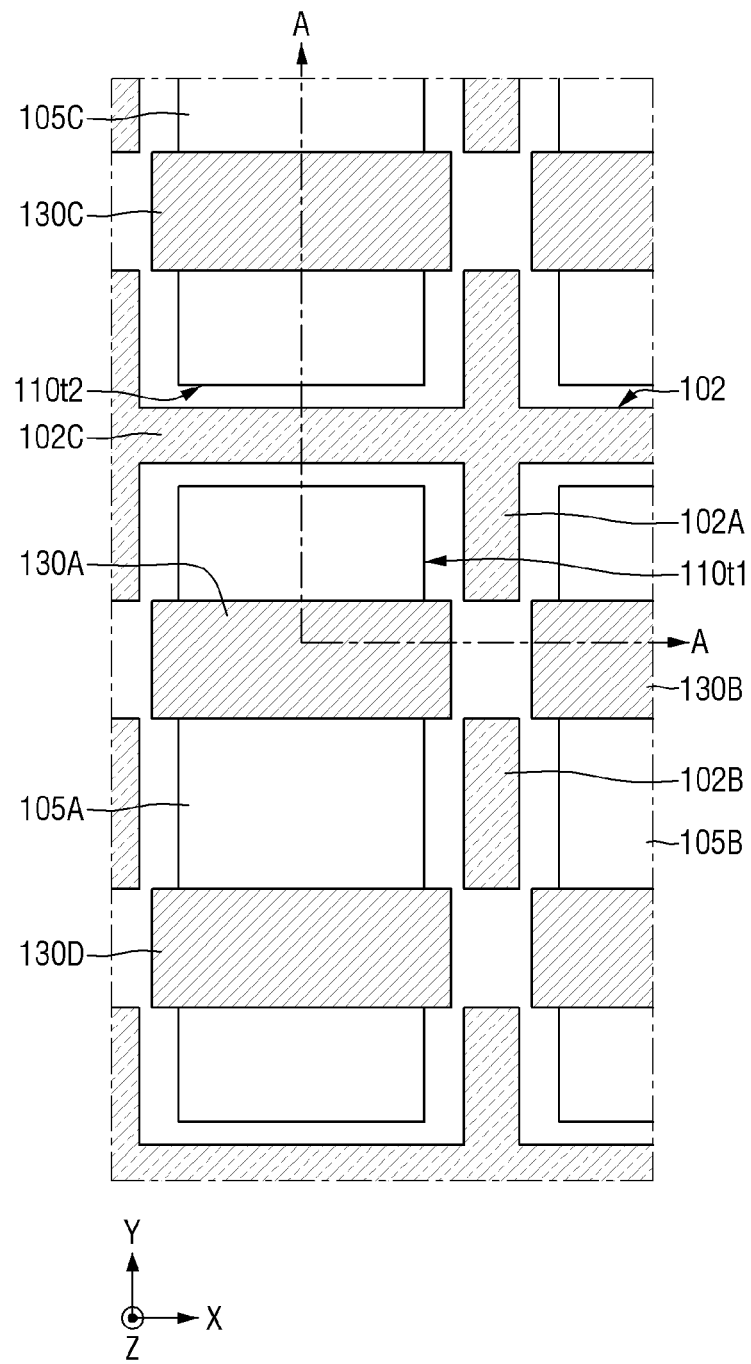
Figure 23:
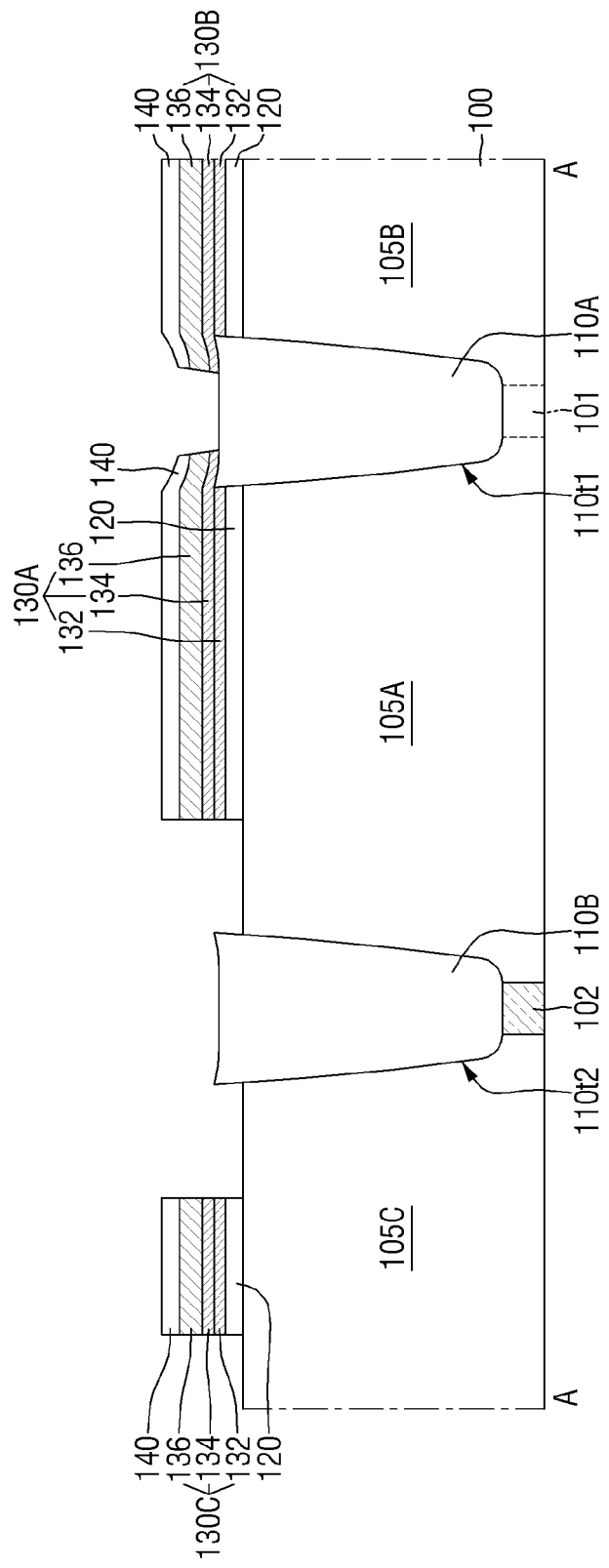

Referring to FIGS. 22 and 23, the first to third gate electrodes 130A, 130B, and 130C are formed on the first to third active regions 105A, 105B, and 105C, respectively.

The gate dielectric layer 120, the first conductive layer 132, the second conductive layer 134, the third conductive layer 136, and the gate capping layer 140 stacked on the first substrate 100 may be patterned. Accordingly, the first gate electrode 130A extending in the first direction X on the first active region 105A, the second gate electrode 130B extending in the first direction X on the second active region 105B, and the third gate electrode 130C extending in the first direction X on the third active region 105C may be formed.

Figure 24:
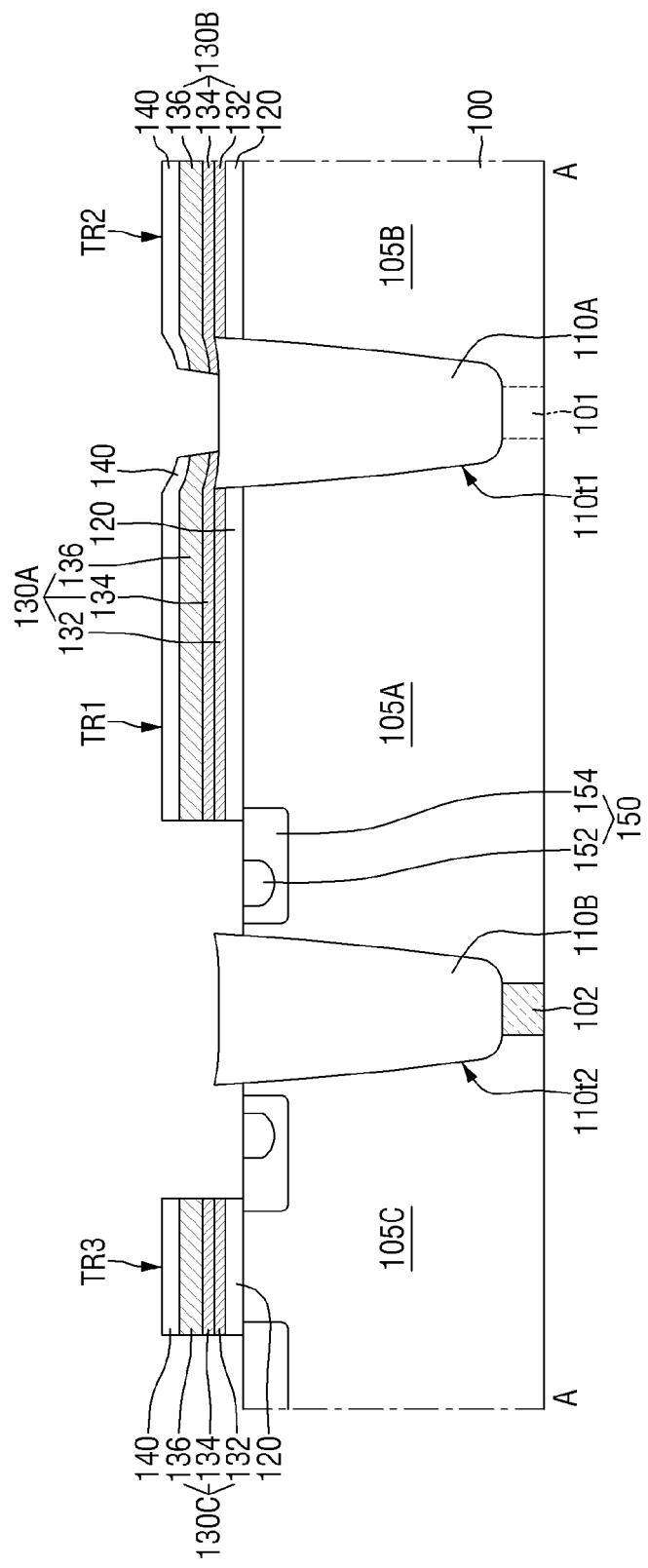

Then, referring to FIG. 24, the source/drain region 150 is formed in each of the first to third active regions 105A, 105B, and 105C.

The source/drain regions 150 may be located on both sides of each of the first to third gate electrodes 130A, 130B, and 130C. The source/drain region 150 may be formed by, but not limited to, e.g., the ion implant process. The source/drain region 150 may include a low-concentration impurity region 154 and a high-concentration impurity region 152 formed in the low-concentration impurity region 154 and surrounded by the low-concentration impurity region 154. The source/drain region 150 may be doped with the second conductivity type (e.g., n-type) impurities. Accordingly, the first to third circuit elements TR1, TR2, and TR3 may be formed on the first to third active regions 105A, 105B, and 105C, respectively.

Then, referring to FIG. 2, the gate contact 162 and the source/drain contact 164 are formed on the first substrate 100.

The first substrate 100, the element isolation layers 110A and 110B, and the interlayer insulating layer 190 covering the first to third circuit elements TR1, TR2, and TR3 may be formed. The gate contact 162 may be connected to each of the first to third gate electrodes 130A, 130B, and 130C while penetrating the interlayer insulating layer 190. The source/drain contact 164 may be connected to the source/drain region 150 while penetrating the interlayer insulating layer 190. For example, the source/drain contact 164 may be in contact with the high-concentration impurity region 152 of the source/drain region 150

Hereinafter, an electronic system including a semiconductor device according to an embodiment of the present disclosure will be described with reference to FIGS. 1, 2 and 25 to 28.

Figure 25:
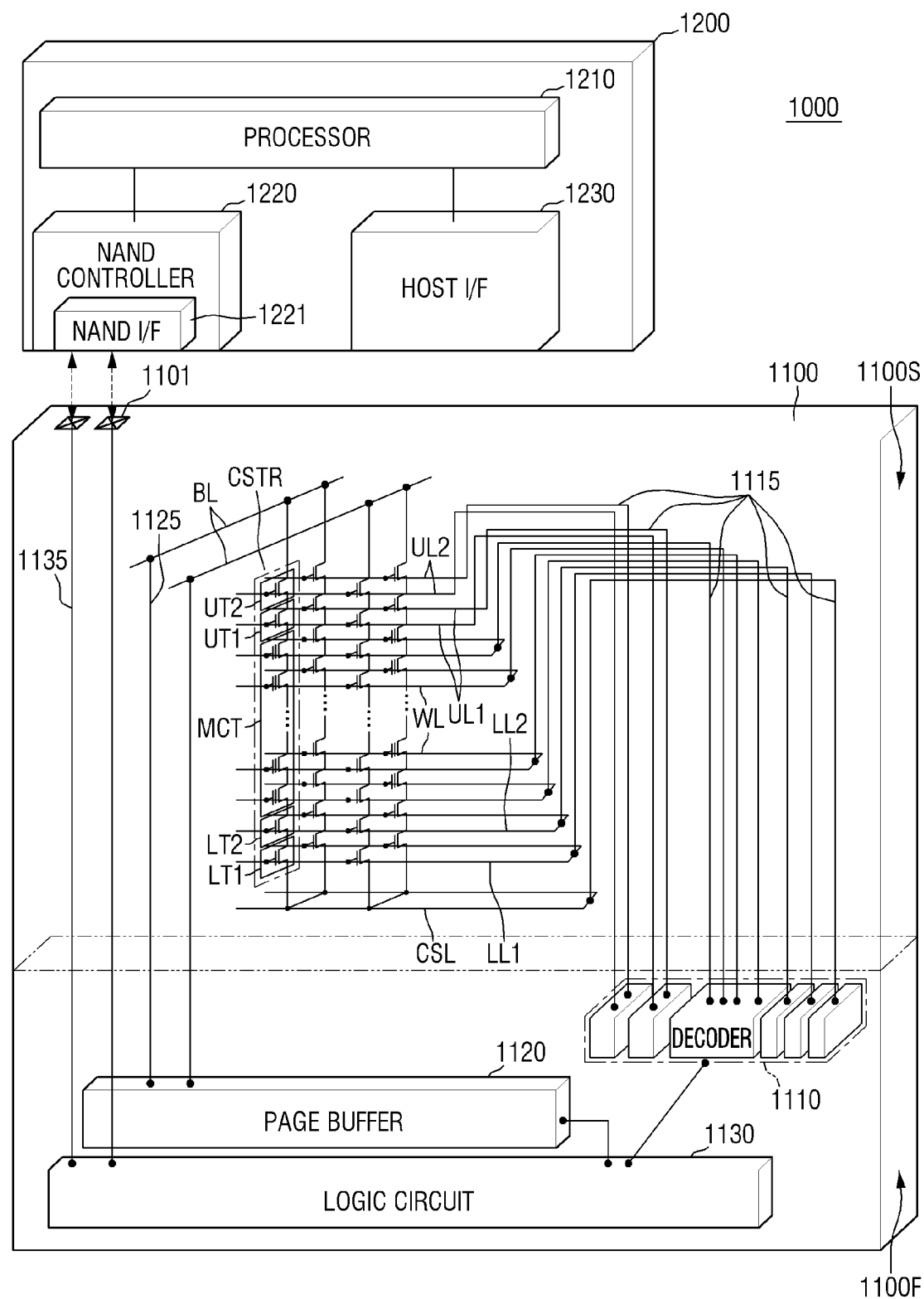
FIG. 25 is a block diagram illustrating an electronic system including a semiconductor device according to an embodiment of the present disclosure.
Figure 26:
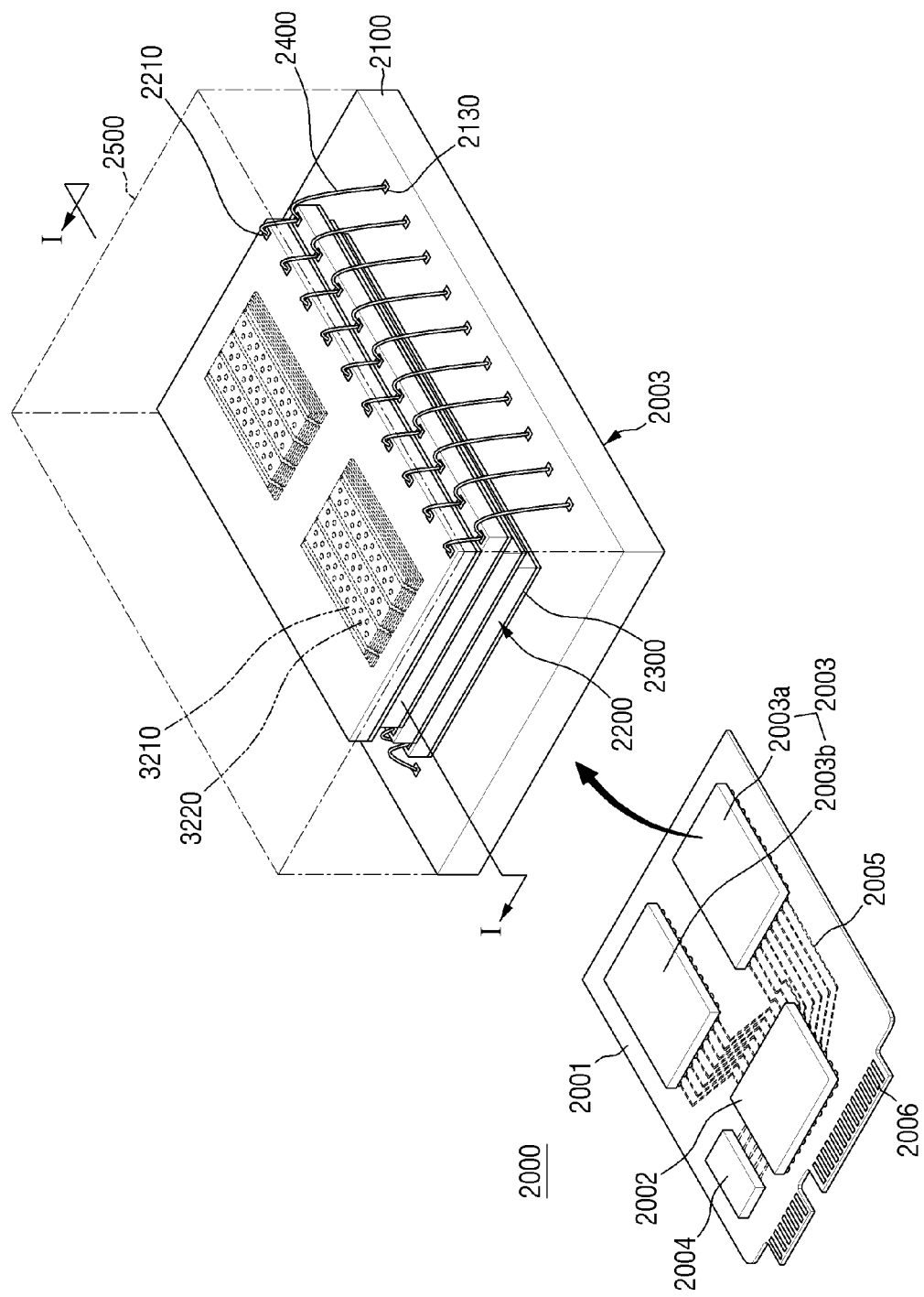
FIG. 26 is a schematic perspective view illustrating an electronic system including a semiconductor device according to an embodiment of the present disclosure.
Figure 27:
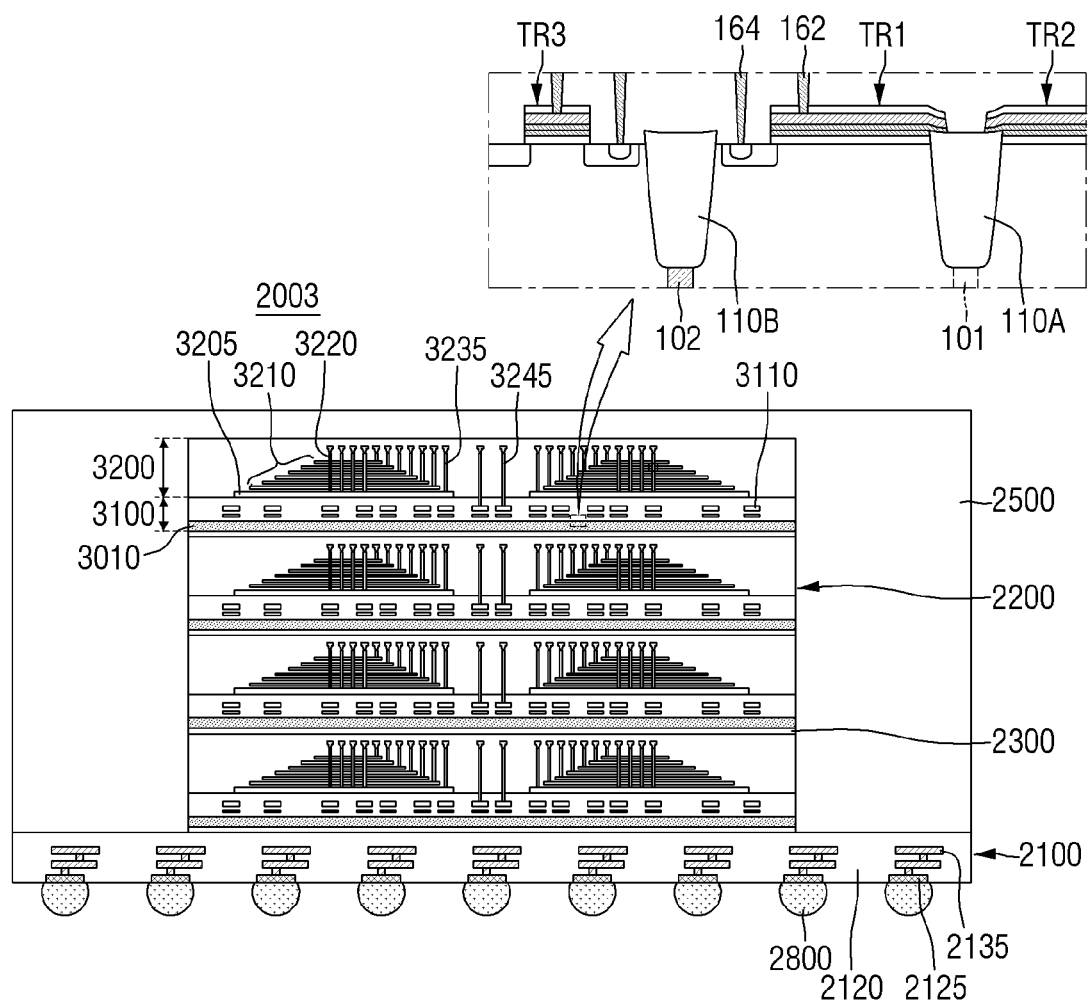
FIGS. 27 and 28 are various schematic cross-sectional views taken along line I-I of FIG. 26.
Figure 28:
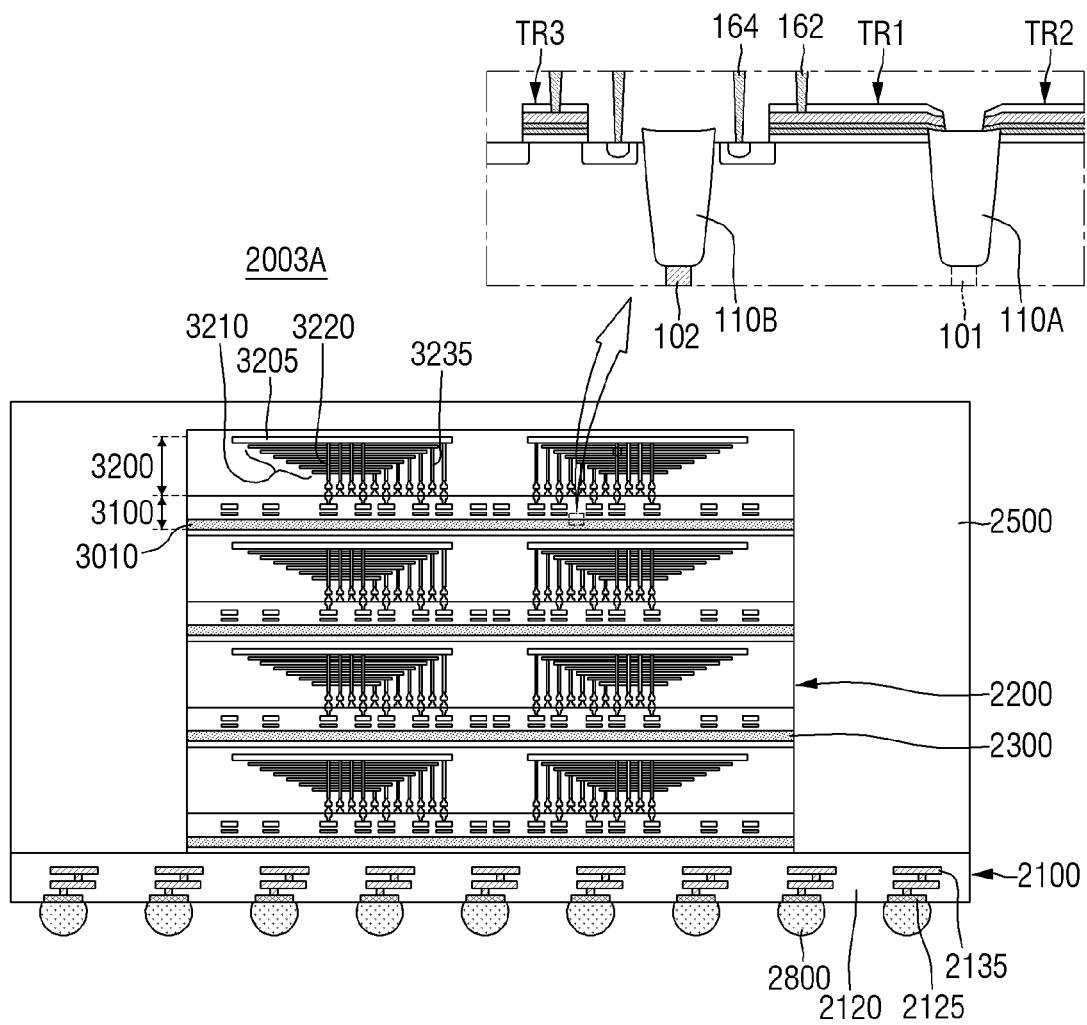

FIG. 25 is a block diagram illustrating an electronic system including a semiconductor device according to an embodiment of the present disclosure. FIG. 26 is a schematic perspective view illustrating an electronic system including a semiconductor device according to an embodiment of the present disclosure. FIGS. 27 and 28 are various schematic cross-sectional views taken along line I-I of FIG. 26.

Referring to FIG. 25, an electronic system 1000 including a semiconductor device according to an embodiment of the present disclosure may include a nonvolatile memory device 1100, and a controller 1200 electrically connected to the nonvolatile memory device 1100. The electronic system 1000 may be a storage device including one or a plurality of nonvolatile memory devices 1100, or an electronic device including a storage device. For example, the electronic system 1000 may be, for example, a solid state drive (SSD) device, a universal serial bus (USB), a computing system, a medical device, or a communication device including one or a plurality of nonvolatile memory devices 1100.

The nonvolatile memory device 1100 may be a NAND flash memory device, e.g., the nonvolatile memory device described with reference to FIGS. 7 to 11. The nonvolatile memory device 1100 may communicate with the controller 1200 through an input/output pad 1101 electrically connected to the logic circuit 1130. The input/output pad 1101 may be electrically connected to the logic circuit 1130 through an input/output connection wiring 1135 extending from the first structure 1100F to the second structure 1100S. The input/output connection wiring 1135 may be, e.g., the first input/output contact plug 203 or the second input/output contact plug 303 described with reference to FIGS. 7 to 11.

An electronic system 1000 including a semiconductor device according to an embodiment of the present disclosure may control the first to third circuit elements TR1, TR2, and TR3 using the controller 1200. For example, as described above, the logic circuit 1130 may be connected to each of the first to third gate electrodes 130A, 130B, and 130C. The first to third gate electrodes 130A, 130B, and 130C may be controlled by the controller 1200 such that a voltage is applied to each of the first to third gate electrodes 130A, 130B, and 130C.

The controller 1200 may include a processor 1210, a NAND controller 1220, and a host interface (HOST I/F) 1230. In an embodiment of the present disclosure, the electronic system 1000 may include the plurality of nonvolatile memory devices 1100. In this case, the controller 1200 may control the plurality of nonvolatile memory devices 1100. The detailed description of the nonvolatile memory device 1100 may be referred to the description of FIG. 7.

The processor 1210 may control the overall operation of the electronic system 1000 including the controller 1200. The processor 1210 may operate according to a predetermined firmware, and may access the nonvolatile memory device 1100 by controlling the NAND controller 1220. The NAND controller 1220 may include a NAND interface (NAND I/F) 1221 that communicates with the nonvolatile memory device 1100. A control command for controlling the nonvolatile memory device 1100, data to be written to the memory cell transistors MCT of the nonvolatile memory device 1100, data to be read from the memory cell transistors MCT of the nonvolatile memory device 1100, and the like may be transmitted through the NAND interface 1221. The host interface 1230 may provide a communication function between the electronic system 1000 and an external host. When the control command is received from the external host through the host interface 1230, the processor 1210 may control the nonvolatile memory device 1100 in response to the control command.

Referring to FIG. 26, an electronic system 2000 including a semiconductor device according to an embodiment of the present disclosure may include a main substrate 2001, a main controller 2002 mounted on the main substrate 2001, one or more semiconductor packages 2003, and a dynamic random access memory (DRAM) 2004. The semiconductor package 2003 and the DRAM 2004 may be connected to the main controller 2002 by wiring patterns 2005 formed on the main substrate 2001.

The main substrate 2001 may include a connector 2006 having a plurality of pins connected to the external host. In the connector 2006, the number and arrangement of the pins may vary depending on a communication interface between the electronic system 2000 and the external host. In an embodiment of the present disclosure, the electronic system 2000 may communicate with the external host through any one of interfaces such as universal serial bus (USB), peripheral component interconnect express (PCIe), serial advanced technology attachment (SATA), and M-PHY for universal flash storage (UFS). In an embodiment of the present disclosure, the electronic system 2000 may be operated by a power supplied from the external host through the connector 2006. The electronic system 2000 may further include a power management integrated circuit (PMIC) that distributes the power supplied from the external host to the main controller 2002 and the semiconductor package 2003.

The main controller 2002 may write or read data to/from the semiconductor package 2003, and may increase the operation speed of the electronic system 2000.

The DRAM 2004 may be a buffer memory for reducing a speed difference between the external host and the semiconductor package 2003 as a data storage space. The DRAM 2004 included in the electronic system 2000 may also operate as a sort of cache memory, and may also provide a space for temporarily storing data in controlling the semiconductor package 2003. When the electronic system 2000 includes the DRAM 2004, the main controller 2002 may include not only a NAND controller for controlling the semiconductor package 2003 but also a DRAM controller for controlling the DRAM 2004.

The semiconductor packages 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 disposed on the package substrate 2100, adhesive layers 2300 respectively disposed on the bottom surfaces of the semiconductor chips 2200, connection structures 2400 electrically connecting the semiconductor chips 2200 to the package substrate 2100, and a molding layer 2500 covering the semiconductor chips 2200 and the connection structures 2400 above the package substrate 2100.

The package substrate 2100 may be a printed circuit board (PCB) including upper package pads 2130. Each of the semiconductor chips 2200 may include an input/output pad 2210. The input/output pad 2210 may correspond to the input/output pad 1101 of FIG. 25. Each of the semiconductor chips 2200 may include gate stacked structures 3210 and memory channel structures 3220. The gate stacked structures 3210 may correspond to the memory block of FIG. 8, and the memory channel structure 3220 may correspond to the channel structure CH of FIG. 8. Each of the semiconductor chips 2200 may include the nonvolatile memory device described with reference to FIGS. 7 to 11.

In an embodiment of the present disclosure, the connection structure 2400 may be a bonding wire that electrically connects the input/output pad 2210 to the upper package pads 2130. Accordingly, in each of the first and second semiconductor packages 2003a and 2003b, the semiconductor chips 2200 may be electrically connected to each other, and may be electrically connected to the upper package pads 2130 of the package substrate 2100, by a wire bonding method. In an embodiment of the present disclosure, in each of the first and second semiconductor packages 2003a and 2003b, the semiconductor chips 2200 may be electrically connected to each other by a connection structure including a through silicon via (TSV) instead of the wire bonding type connection structure 2400.

In an embodiment of the present disclosure, the main controller 2002 and the semiconductor chips 2200 may be included in one package. In an embodiment of the present disclosure, the main controller 2002 and the semiconductor chips 2200 may be mounted on a separate interposer substrate different from the main substrate 2001, and the main controller 2002 may be connected to the semiconductor chips 2200 by wirings formed on the interposer substrate.

Referring to FIG. 27, in the semiconductor package 2003, the package substrate 2100 may be a printed circuit board (PCB). The package substrate 2100 may include a package substrate body portion 2120, the upper package pads 2130 disposed on the top surface of the package substrate body portion 2120, lower pads 2125 arranged on the bottom surface of the package substrate body portion 2120 or exposed through the bottom surface thereof, and internal wirings 2135 electrically connecting the upper package pads 2130 (see FIG. 26) to the lower pads 2125 in the package substrate body portion 2120. The upper package pads 2130 may be electrically connected to the connection structures 2400. The lower pads 2125 may be connected to the wiring patterns 2005 of the main substrate 2001 of the electronic system 2000 through conductive connectors 2800, as shown in FIG. 26.

Each of the semiconductor chips 2200 may include a first structure 3100 and a second structure 3200 that are sequentially stacked. The first structure 3100 may correspond to the peripheral circuit region PERI of FIG. 8, and the second structure 3200 may correspond to the cell region CELL of FIG. 8. For example, the first structure 3100 may include a first semiconductor substrate 3010 corresponding to the first substrate 100 of FIG. 8. The second structure 3200 may include a second semiconductor substrate 3205 corresponding to the second substrate 310 of FIG. 8. Further, the second structure 3200 may include the gate stacked structures 3210 and the memory channel structures 3220 described with reference to FIG. 26.

The second structure 3200 may include gate connection wirings 3235. The gate connection wirings 3235 may be electrically connected to the gate stacked structure 3210. The gate connection wirings 3235 may correspond to the cell contact plugs 340 of FIG. 8.

Each of the semiconductor chips 2200 may include a through wiring 3245 that is electrically connected to peripheral wirings 3110 of the first structure 3100 and extends into the second structure 3200. The through wiring 3245 may be disposed outside the gate stacked structure 3210 and may be further disposed to penetrate the gate stacked structure 3210. Each of the semiconductor chips 2200 may further include the input/output pad 2210 (see, e.g., FIG. 26) electrically connected to the peripheral wirings 3110 of the first structure 3100.

In an embodiment of the present disclosure, the first structure 3100 may include the element isolation layers 110A and 110B, the first to third circuit elements TR1, TR2, and TR3, the isolation impurity region 102, the connection region 101, the gate contact 162, and the source/drain contact 164 described with reference to FIGS. 1 and 2. For example, the isolation impurity region 102 may maintain the isolation effect between the active regions 105A, 105B, and 105C (see FIGS. 1 and 2). For example, the connection region 101 may be a region of the first substrate 100 (the first semiconductor substrate 3010) in which the isolation impurity region 102 is not formed. Since the connection region 101 may connect the first to third active regions 105A, 105B, and 105C, the body effect may be reduced.

Referring to FIG. 28, in a semiconductor package 2003A, each of the semiconductor chips 2200 may include the first structure 3100 and the second structure 3200 that are bonded by a wafer bonding method. For example, the first structure 3100 may correspond to the peripheral circuit region PERI of FIG. 11, and the second structure 3200 may correspond to the cell region CELL of FIG. 11. For example, the structure of each of the semiconductor chips 2200 illustrated in FIG. 28 is a C2C structure, and is also a COP structure.

The semiconductor chips 2200 of FIGS. 27 and 28 may be electrically connected to each other by the bonding wire type connection structures 2400 (see FIG. 26). However, in an embodiment of the present disclosure, the semiconductor chips in one semiconductor package, such as the semiconductor chips 2200 of FIGS. 27 and 28, may be electrically connected to each other by the connection structure including the through silicon via TSV.

Although the embodiments of the present disclosure have been described above referring to the accompanying drawings, the present disclosure is not limited to the embodiments disclosed and may be fabricated in various different forms. Those who have ordinary knowledge in the technical field to which the present disclosure belongs will understand that the present disclosure can be carried out in various other forms without departing from the spirit and scope of the present disclosure as define in the appended claims. Therefore, it should be understood that the embodiments described above are exemplary in all respects and are not limitative.

What is claimed is:
1. A semiconductor device comprising:
a first active region and a second active region arranged along a first direction in a substrate;
an element isolation layer disposed in the substrate, the element isolation layer extending in a second direction crossing the first direction to isolate the first active region and the second active region;

a first gate electrode extending in the first direction on the first active region;

a second gate electrode extending in the first direction on the second active region; and an isolation impurity region containing impurities of a first conductivity type in the substrate and disposed below the element isolation layer, wherein the isolation impurity region includes a first isolation region and a second isolation region spaced apart from each other in the second direction, at least a part of the substrate interposed between the first gate electrode and the second gate electrode is interposed between the first isolation region and the second isolation region, and is surrounded by the first gate electrode, the first isolation region, the second gate electrode, and the second isolation region from four sides in a plan view, and the isolation impurity region which overlaps the element isolation layer in a vertical direction surrounds only a part of the first active region in the plan view.

2. The semiconductor device of claim 1, further comprising a source/drain region containing impurities of a second conductivity type different from the first conductivity type in the first active region and disposed on one side of the first gate electrode.

3. The semiconductor device of claim 2, further comprising a source/drain contact extending in a third direction intersecting a top surface of the substrate and connected to the source/drain region, wherein the first isolation region and the source/drain contact overlap in the first direction in the plan view.

4. The semiconductor device of claim 3, wherein at least a part of the substrate interposed between the first isolation region and the second isolation region does not overlap the source/drain contact in the first direction in the plan view.

5. The semiconductor device of claim 1, further comprising a third active region disposed in the substrate, the first active region and the third active region being arranged along the second direction, wherein the isolation impurity region further includes a third isolation region extending in the first direction to cross between the first active region and the third active region.

6. The semiconductor device of claim 1, further comprising a gate dielectric layer interposed between the first active region and the first gate electrode and between the second active region and the second gate electrode.

7. The semiconductor device of claim 1, wherein the substrate contains impurities of the first conductivity type, and a doping concentration of the isolation impurity region is higher than a doping concentration of the substrate.

8. The semiconductor device of claim 1, wherein the isolation impurity region contains boron (B).

9. The semiconductor device of claim 1, wherein a first distance between the first isolation region and a centerline passing through a center of the first gate electrode and extending in the first direction is the same as a second distance between the second isolation region and the centerline.

10. The semiconductor device of claim 1, wherein a width of the first isolation region in the first direction and a width of the second isolation region in the first direction are smaller than a width of the element isolation layer in the first direction.

11. The semiconductor device of claim 1, wherein the element isolation layer protrudes from a top surface of the first active region and a top surface of the second active region.

12. A semiconductor device comprising:

a substrate containing impurities of a first conductivity type at a first doping concentration;

an element isolation layer defining a first active region in the substrate;

a first gate electrode extending in a first direction on the first active region; and an isolation impurity region containing impurities of the first conductivity type at a second doping concentration higher than the first doping concentration in the substrate and disposed below the element isolation layer, wherein the isolation impurity region does not overlap at least a part of the first gate electrode in the first direction in a plan view, and the isolation impurity region which overlaps the element isolation layer in a vertical direction surrounds only a part of the first active region in the plan view.

13. The semiconductor device of claim 12, further comprising:

a second active region disposed in the substrate, the second active region being spaced apart from the first active region in the first direction with the element isolation layer interposed therebetween; and a second gate electrode extending in the first direction on the second active region, wherein the isolation impurity region does not overlap at least a part of the second gate electrode in the first direction in the plan view.

14. The semiconductor device of claim 13, wherein the substrate includes a connection region disposed below the element isolation layer between the first gate electrode and the second gate electrode, and the isolation impurity region includes a first isolation region and a second isolation region spaced apart from each other in a second direction crossing the first direction with the connection region interposed therebetween.

15. The semiconductor device of claim 12, further comprising a source/drain region containing impurities of a second conductivity type different from the first conductivity type in the first active region and disposed on one side of the first gate electrode.

16. A nonvolatile memory device comprising:

a first substrate of a peripheral circuit region and a second substrate of a cell region;

an element isolation layer defining a first active region in the first substrate;

a first gate electrode extending in a first direction on the first active region;

an isolation impurity region containing impurities of a first conductivity type in the first substrate and disposed below the element isolation layer;

a plurality of word lines sequentially stacked on the second substrate;

a channel structure disposed on the second substrate, the channel structure intersecting the plurality of word lines; and a bit line connected to the channel structure, wherein the isolation impurity region does not overlap at least a part of the first gate electrode in the first direction in a plan view, and the isolation impurity region which overlaps the element isolation layer in a vertical direction surrounds only a part of the first active region in the plan view.

17. The nonvolatile memory device of claim 16, further comprising a source/drain region containing impurities of a second conductivity type different from the first conductivity type in the first active region and disposed on one side of the first gate electrode, wherein each of the word lines is connected to the source/drain region.

18. The nonvolatile memory device of claim 17, further comprising a connection contact plug configured to penetrate the peripheral circuit region to connect each of the word lines to the source/drain region.

19. The nonvolatile memory device of claim 17, further comprising:

a lower bonding metal connected to the source/drain region; and an upper bonding metal connected to each of the word lines, wherein the lower bonding metal and the upper bonding metal are bonded.

20. The nonvolatile memory device of claim 16, further comprising:

a second active region disposed in the first substrate, the second active region being spaced apart from the first active region in the first direction with the element isolation layer interposed therebetween; and a second gate electrode extending in the first direction on the second active region, wherein the isolation impurity region does not overlap at least a part of the second gate electrode in the first direction in the plan view.

* * * * *